(12) United States Patent
Price et al.

(10) Patent No.: US 12,342,609 B2
(45) Date of Patent: Jun. 24, 2025

(54) ELECTRONIC CIRCUIT COMPRISING TRANSISTOR AND RESISTOR

(71) Applicant: PRAGMATIC SEMICONDUCTOR LIMITED, Cambridge (GB)

(72) Inventors: Richard Price, Sedgefield (GB); Catherine Ramsdale, Sedgefield (GB); Peter Fergus Downs, Sedgefield (GB)

(73) Assignee: PRAGMATIC SEMICONDUCTOR LIMITED, Cambridge (GB)

( * ) Notice: Subject to any disclaimer, the term of this patent is extended or adjusted under 35 U.S.C. 154(b) by 233 days.

(21) Appl. No.: 17/636,083

(22) PCT Filed: Aug. 19, 2020

(86) PCT No.: PCT/GB2020/051987
§ 371 (c)(1),
(2) Date: Feb. 17, 2022

(87) PCT Pub. No.: WO2021/032978
PCT Pub. Date: Feb. 25, 2021

(65) Prior Publication Data
US 2022/0359578 A1    Nov. 10, 2022

(30) Foreign Application Priority Data
Aug. 21, 2019 (GB) .................................... 1912025

(51) Int. Cl.
*H10D 84/80*    (2025.01)
*H01C 1/01*    (2006.01)
(Continued)

(52) U.S. Cl.
CPC ............ *H10D 84/811* (2025.01); *H01C 1/01* (2013.01); *H01C 1/14* (2013.01); *H01C 17/28* (2013.01);
(Continued)

(58) Field of Classification Search
CPC .......... H01C 1/01; H01C 1/014; H01C 17/28; H01L 27/0629; H01L 27/1225; H01L 27/1255; H01L 27/127
See application file for complete search history.

(56) References Cited

U.S. PATENT DOCUMENTS 3,996,551 A    12/1976 Croson
4,609,903 A    9/1986 Toyokura et al.
(Continued)

FOREIGN PATENT DOCUMENTS

CN    1359156 A    7/2002
CN    1409400 A    4/2003
(Continued)

OTHER PUBLICATIONS

U.S. Appl. No. 17/636,090, filed Feb. 17, 2022, Price et al.
(Continued)

*Primary Examiner* — Kyung S Lee
(74) *Attorney, Agent, or Firm* — Jason H. Vick; Amped IP LLC

(57) ABSTRACT

A method of manufacturing an electronic circuit (or circuit module) (100) is disclosed. The electronic circuit comprises a transistor (1) and a resistor (2), the transistor comprising a source terminal (11), a drain terminal (12), a gate terminal (13), and a first body (10) of material providing a controllable semi-conductive channel between the source and drain terminals, and the resistor comprises a first resistor terminal (21), a second resistor terminal (22), and a second body (20) of material providing a resistive current path between the first resistor terminal and the second resistor terminal. The method comprises: forming the first body (10); and forming the second body (20), wherein the first body comprises a first quantity (100) of a metal oxide and the second body com-
(Continued)

prises a second quantity (200) of said metal oxide. Corresponding electronic circuits are disclosed.

17 Claims, 10 Drawing Sheets

(51) Int. Cl.

| | | |
|---|---|---|
| H01C 1/14 | (2006.01) | |
| H01C 17/28 | (2006.01) | |
| H01L 21/02 | (2006.01) | |
| H10D 1/47 | (2025.01) | |
| H10D 8/60 | (2025.01) | |
| H10D 30/67 | (2025.01) | |
| H10D 62/80 | (2025.01) | |
| H10D 84/00 | (2025.01) | |
| H10D 84/02 | (2025.01) | |
| H10D 86/01 | (2025.01) | |
| H10D 86/40 | (2025.01) | |
| H10D 86/60 | (2025.01) | |
| H10D 99/00 | (2025.01) | |

(52) U.S. Cl.
CPC ......... *H01L 21/02565* (2013.01); *H10D 1/47* (2025.01); *H10D 8/60* (2025.01); *H10D 30/6755* (2025.01); *H10D 62/80* (2025.01); *H10D 84/02* (2025.01); *H10D 84/204* (2025.01); *H10D 86/0221* (2025.01); *H10D 86/423* (2025.01); *H10D 86/481* (2025.01); *H10D 86/60* (2025.01); *H10D 99/00* (2025.01)

(56) References Cited

U.S. PATENT DOCUMENTS

| | | |
|---|---|---|
| 5,466,484 A | 11/1995 | Spraggins et al. |
| 5,489,547 A | 2/1996 | Erdeljac et al. |
| 5,872,381 A | 2/1999 | Kato et al. |
| 5,930,638 A | 7/1999 | Reedy et al. |
| 6,403,438 B1 | 6/2002 | Santangelo |
| 7,183,593 B2 | 2/2007 | Yeo et al. |
| 7,633,373 B1 | 12/2009 | Johnson et al. |
| 8,343,819 B2 | 1/2013 | Doris et al. |
| 8,513,723 B2 | 8/2013 | Booth, Jr. et al. |
| 9,406,872 B1 | 8/2016 | Annunziata et al. |
| 9,446,946 B2 | 9/2016 | Schalberger et al. |
| 10,204,683 B2 | 2/2019 | Price et al. |
| 11,316,518 B2 | 4/2022 | De Oliveira |
| 11,575,380 B2 | 2/2023 | De Oliveira |
| 2001/0041412 A1 | 11/2001 | Takasu |
| 2002/0084487 A1 | 7/2002 | Takasu |
| 2002/0084492 A1 | 7/2002 | Osanai et al. |
| 2003/0047782 A1 | 3/2003 | Hasegawa et al. |
| 2004/0183130 A1 | 9/2004 | Hara |
| 2005/0035409 A1 | 2/2005 | Ko et al. |
| 2005/0074929 A1 | 4/2005 | Hasegawa et al. |
| 2005/0181589 A1 | 8/2005 | Miyawaki |
| 2005/0242349 A1 | 11/2005 | Lee et al. |
| 2005/0253178 A1 | 11/2005 | Yamaguchi et al. |
| 2006/0091793 A1 | 5/2006 | Baude et al. |
| 2006/0145296 A1 | 7/2006 | Coolbaugh et al. |
| 2006/0189049 A1 | 8/2006 | Afentakis et al. |
| 2006/0249793 A1 | 11/2006 | Beach et al. |
| 2007/0041141 A1 | 2/2007 | Deng |
| 2007/0046421 A1 | 3/2007 | Gogineni et al. |
| 2008/0237800 A1 | 10/2008 | Chinthakindi et al. |
| 2009/0090977 A1 | 4/2009 | Freeman et al. |
| 2010/0013026 A1 | 1/2010 | Booth, Jr. et al. |
| 2010/0079169 A1 | 4/2010 | Kim et al. |
| 2010/0148168 A1 | 6/2010 | Lai et al. |
| 2010/0156588 A1 | 6/2010 | Privitera |
| 2011/0012112 A1 | 1/2011 | Yamazaki et al. |
| 2011/0012117 A1 | 1/2011 | Yamazaki et al. |
| 2011/0057918 A1 | 3/2011 | Kimura et al. |
| 2011/0097860 A1 | 4/2011 | Iida |
| 2011/0133177 A1 | 6/2011 | Suzawa et al. |
| 2011/0169089 A1 | 7/2011 | Doris et al. |
| 2011/0175152 A1 | 7/2011 | Booth, Jr. et al. |
| 2012/0098071 A1 | 4/2012 | Aggarwal et al. |
| 2012/0187493 A1 | 7/2012 | Doris et al. |
| 2013/0092924 A1 | 4/2013 | Sasagawa et al. |
| 2013/0221346 A1 | 8/2013 | Lu et al. |
| 2013/0309808 A1 | 11/2013 | Zhang et al. |
| 2013/0328169 A1 | 12/2013 | Choi |
| 2014/0021583 A1 | 1/2014 | Lo et al. |
| 2014/0027702 A1 | 1/2014 | Lu et al. |
| 2014/0306219 A1 | 10/2014 | Yamazaki et al. |
| 2015/0093844 A1 | 4/2015 | Hsia et al. |
| 2015/0155313 A1 | 6/2015 | Yamazaki et al. |
| 2015/0162396 A1 | 6/2015 | Yagi et al. |
| 2015/0187878 A1 | 7/2015 | Yamazaki et al. |
| 2015/0294984 A1 | 10/2015 | Cheng et al. |
| 2015/0318340 A1 | 11/2015 | Dirnecker |
| 2016/0093638 A1 | 3/2016 | Cheng et al. |
| 2016/0123817 A1 | 5/2016 | Bennett et al. |
| 2016/0141312 A1 | 5/2016 | Nakatani et al. |
| 2016/0163738 A1 | 6/2016 | Sato |
| 2016/0233338 A1 | 8/2016 | Lu et al. |
| 2016/0329392 A1 | 11/2016 | Miyake |
| 2017/0125604 A1 | 5/2017 | Oshima |
| 2017/0162646 A1 | 6/2017 | Lee et al. |
| 2017/0301796 A1 | 10/2017 | Ishihara et al. |
| 2018/0019297 A1 | 1/2018 | Direcker et al. |
| 2018/0046004 A1 | 2/2018 | Yamazaki et al. |
| 2018/0261664 A1 | 9/2018 | Direcker et al. |
| 2018/0337288 A1 | 11/2018 | Shin |
| 2019/0019859 A1 | 1/2019 | Daigle et al. |
| 2019/0148361 A1 | 5/2019 | Lu et al. |
| 2019/0221516 A1 | 7/2019 | Kande et al. |
| 2019/0346500 A1 | 11/2019 | Ren et al. |
| 2020/0135445 A1 | 4/2020 | Yamazaki et al. |
| 2020/0295126 A1 | 9/2020 | Agam et al. |
| 2021/0226629 A1 | 7/2021 | De Oliveira |
| 2022/0216871 A1 | 7/2022 | De Oliveira |
| 2023/0238377 A1 | 7/2023 | Price et al. |

FOREIGN PATENT DOCUMENTS

| | | |
|---|---|---|
| CN | 1722448 A | 1/2006 |
| CN | 102576732 A | 7/2012 |
| CN | 103311128 A | 9/2013 |
| CN | 106463507 A | 2/2017 |
| CN | 107305843 A | 10/2017 |
| CN | 109786365 A | 5/2019 |
| CN | 114556495 A | 5/2022 |
| CN | 114556603 A | 5/2022 |
| CN | 114600234 A | 6/2022 |
| DE | 102020000633 A1 | 9/2020 |
| EP | 1063630 A2 | 12/2000 |
| EP | 2202802 A1 | 6/2010 |
| EP | 3236503 A1 | 10/2017 |
| EP | 2979302 B1 | 12/2020 |
| GB | 727505 A | 4/1955 |
| GB | 2490752 A | 11/2012 |
| GB | 2525184 A | 10/2015 |
| GB | 2561004 A | 10/2018 |
| GB | 2570569 A | 7/2019 |
| GB | 2586520 A | 2/2021 |
| GB | 2586522 A | 2/2021 |
| GB | 2587793 A | 4/2021 |
| GB | 2589937 A | 6/2021 |
| GB | 2586520 A9 | 10/2021 |
| GB | 2598074 A | 2/2022 |
| GB | 2602408 A | 6/2022 |
| GB | 2610886 A | 3/2023 |
| JP | S 60-94757 A | 5/1985 |
| JP | 2003-007847 A | 1/2003 |
| JP | 2002-124641 A | 4/2004 |
| JP | 2008-124188 A | 5/2008 |
| JP | 2010-087518 A | 4/2010 |
| JP | 2010-225725 A | 10/2010 |
| JP | 2011-077106 A | 4/2011 |
| JP | 2018-006412 A | 1/2018 |

(56) References Cited

FOREIGN PATENT DOCUMENTS

| JP | 2018-137423 A | 8/2018 |
|---|---|---|
| WO | WO 89/03121 A1 | 4/1989 |
| WO | WO 93/07629 A | 4/1993 |
| WO | WO 2012/071878 A1 | 6/2012 |
| WO | WO 2015/079362 A1 | 6/2015 |
| WO | WO 2015/097597 A1 | 7/2015 |
| WO | WO 2018/004672 A1 | 1/2018 |
| WO | WO 2018/197988 A1 | 11/2018 |
| WO | WO 2019/116020 A1 | 6/2019 |
| WO | WO 2021/032977 A1 | 2/2021 |
| WO | WO 2021/032979 A1 | 2/2021 |
| WO | WO 2021/032980 A1 | 2/2021 |
| WO | WVO 2021/032981 A1 | 2/2021 |

OTHER PUBLICATIONS

U.S. Appl. No. 17/636,099, filed Feb. 17, 2022, Price et al.
U.S. Appl. No. 17/636,108, filed Feb. 17, 2022, Price.
U.S. Appl. No. 17/636,113, filed Feb. 17, 2022, Price.
Kawakita, Masatoshi et al. "Laterally Configured Resistive Switching Device Based on Transition-Metal Nano-Gap Electrode on Gd Oxide" Applied Physics Letters 108, 023101 (2016).
Mack, Chris A. "Seeing Double" IEEE Spectrum; Nov. 1, 2008.
Nayak, Pradipta K. et al. "Thin Film Complementary Metal Oxide Semiconductor (CMOS) Device Using a Single-Step Deposition of the Channel Layer" Scientific Reports; 4: 4672; Apr. 14, 2014.
International Search Report for International Application No. PCT/GB2020/051987, mailed Nov. 26, 2020.
Written Opinion for International Application No. PCT/GB2020/051987, mailed Nov. 26, 2020.
Invitation to Pay Additional Fees and, Where Applicable, Protest Fee for International Application No. PCT/GB2020/051986, mailed Nov. 5, 2020.
International Search Report for International Application No. PCT/GB2020/051986, mailed Jan. 13, 2021.
Written Opinion for International Application No. PCT/GB2020/051986, mailed Jan. 13, 2021.
International Search Report for International Application No. PCT/GB2020/051988, mailed Nov. 2, 2020.
Written Opinion for International Application No. PCT/GB2020/051988, mailed Nov. 2, 2020.
Invitation to Pay Additional Fees and, Where Applicable, Protest Fee for International Application No. PCT/GB2020/051989, mailed Nov. 25, 2020.
International Search Report for International Application No. PCT/GB2020/051989, mailed Feb. 8, 2021.
Written Opinion for International Application No. PCT/GB2020/051989, mailed Feb. 8, 2021.
Invitation to Pay Additional Fees and, Where Applicable, Protest Fee for International Application No. PCT/GB2020/051990, mailed Nov. 2, 2020.
International Search Report for International Application No. PCT/GB2020/051990, mailed Dec. 23, 2020.
Written Opinion for International Application No. PCT/GB2020/051990, mailed Dec. 23, 2020.
Combined Search and Examination Report Under Sections 17 and 18(3) for Great Britain Application No. 1912025.2, mailed Jan. 28, 2020.
Examination Report Under Section 18(3) for Great Britain Application No. 1912025.2, mailed Jan. 17, 2022.
Search Report Under Section 17(5) for Great Britain Application No. 2000887.6 mailed Jul. 22, 2020.
Search Report Under Section 17(6) for Great Britain Application No. 2000887.6 mailed Mar. 3, 2021.
Combined Search and Examination Report Under Sections 17 and 18(3) for Great Britain Application No. 1913610.0, mailed Mar. 11, 2020.
Examination Report Under Section 18(3) for Great Britain Application No. 1913610.0, mailed Sep. 10, 2021.
Combined Search and Examination Report Under Sections 17 and 18(3) for Great Britain Application No. GB 1915158.8, mailed Apr. 20, 2020.
Combined Search and Examination Report Under Sections 17 and 18(3) for Great Britain Application No. 1917079.4, mailed May 7, 2020.
Search Report Under Section 17(6) for Great Britain Application No. 1917079.4, mailed Mar. 22, 2021.
Examination Report Under Section 18(3) for Great Britain Application No. 1917079.4, mailed Aug. 25, 2021.
Combined Search and Examination Report Under Sections 17 and 18(3) for Great Britain Application No. 2117276.2, mailed Dec. 14, 2021.
International Preliminary Report on Patentability for International Application No. PCT/GB2020/051987, mailed Mar. 3, 2022.
International Preliminary Report on Patentability for International Application No. PCT/GB2020/051986, mailed Mar. 3, 2022.
International Preliminary Report on Patentability for International Application No. PCT/GB2020/051988, mailed Mar. 3, 2022.
International Preliminary Report on Patentability for International Application No. PCT/GB2020/051989, mailed Mar. 3, 2022.
International Preliminary Report on Patentability for International Application No. PCT/GB2020/051990, mailed Mar. 3, 2022.
Klibanov, Lev "Integrated Resistors for an Advanced Node CMOS" EE Times; Nov. 16, 2016.
Wikipedia "Multiple Patterning" Available at https://en.wikipedia.org/w/index.php?title=Multiple_patterning&oldid=914700788; Sep. 8, 2019.
Examination Report Under Section 18(3) for Great Britain Application No. 2000887.6 mailed Mar. 27, 2023.
Notification of First Office Action (Including Translation) for corresponding Chinese Patent Application No. 202080071825.6, mailed Dec. 27, 2023.
Office Action (Restriction Requirement) for U.S. Appl. No. 17/636,099, mailed Dec. 29, 2023.
Combined Search and Examination Report Under Sections 17 and 18(3), for corresponding Great Britain Application No. 2202910.2, mailed Apr. 5, 2022.
Office Action for U.S. Appl. No. 17/636,099, mailed Feb. 29, 2024.
Notification of First Office Action (Including Translation) for corresponding Chinese Patent Application No. 202080071849.1, mailed May 7, 2024.
Office Action for U.S. Appl. No. 17/636,113, mailed Jun. 20, 2024.
Office Action for corresponding European Patent Application No. 20764719.9, mailed Jun. 25, 2024.
Office Action for corresponding European Patent Application No. 20764722.3, mailed Jun. 7, 2024.
Notification of Second Office Action (Including Translation) for corresponding Chinese Patent Application No. 202080071825.6, mailed Jul. 15, 2024.
Notice of Allowance for U.S. Appl. No. 17/636,099, mailed Jul. 31, 2024.
Office Action for U.S. Appl. No. 17/636,108, mailed Jul. 18, 2024.
U.S. Appl. No. 18/931,684, filed Oct. 30, 2024, Price et al.
Notification of First Office Action (Including Translation) for corresponding Chinese Patent Application No. 202080073505.4, mailed Dec. 26, 2024.
Notification of Second Office Action (Including Translation) for corresponding Chinese Patent Application No. 202080071849.1, mailed Oct. 30, 2024.
Office Action (Restriction Requirement) for U.S. Appl. No. 17/636,090 mailed Dec. 23, 2024.
Notice of Allowance for U.S. Appl. No. 17/636,108, mailed Dec. 29, 2024.
Notification of Third Office Action (Including Translation) for corresponding Chinese Patent Application No. 202080071849.1, mailed Mar. 18, 2025.
Office Action for U.S. Appl. No. 17/636,090 mailed Apr. 23, 2025.
Office Action for U.S. Appl. No. 17/636,113, mailed Apr. 10, 2025.

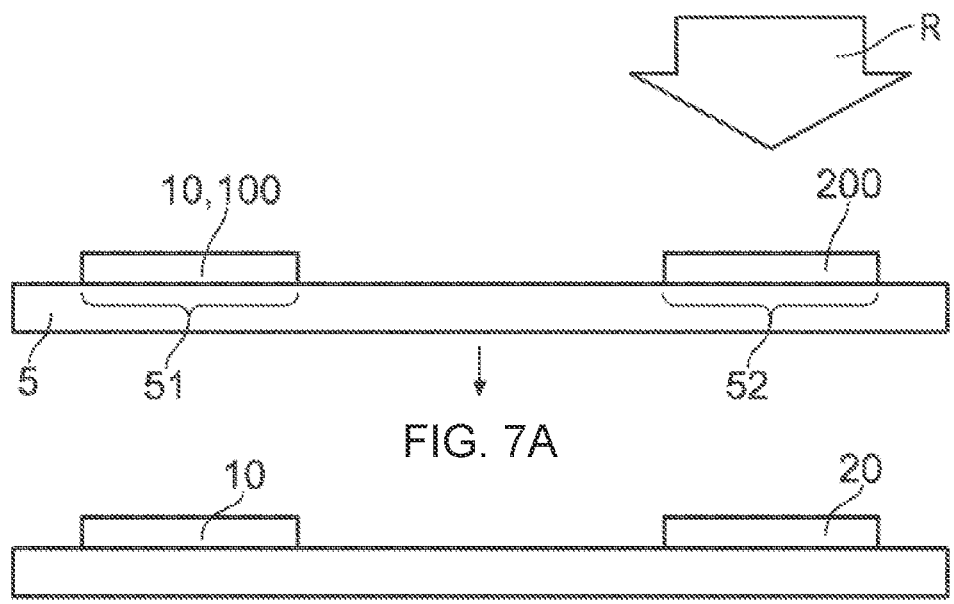
FIG. 7A
FIG. 7B
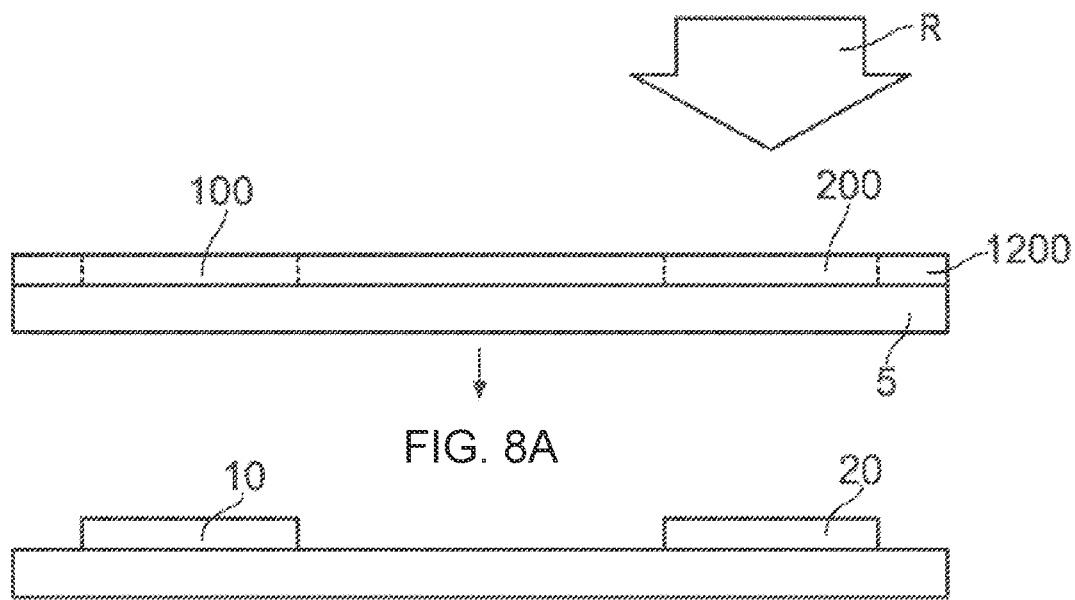
FIG. 8A
FIG. 8B

ELECTRONIC CIRCUIT COMPRISING TRANSISTOR AND RESISTOR

CROSS-REFERENCE TO RELATED APPLICATIONS

This application is a national stage application under 35 U.S.C. 371 of PCT Application No. PCT/GB2020/051987, having an international filing date of 19 Aug. 2020, which designated the United States, which PCT application claimed the benefit of Great Britain Application No. 1912025.2, filed 21 Aug. 2019, each of which are incorporated herein by reference in their entirety.

FIELD

The present invention relates to electronic circuits comprising at least one transistor and at least one resistor, and in particular, although not exclusively, to flexible integrated circuits comprising at least one transistor and at least one resistor.

BACKGROUND

Whilst flexible integrated circuits (FlexICs) are known, there remain few technologies capable of producing low cost FlexICs. Most FlexIC technologies have been developed for application to displays, rather than to digital or analogue processing, sensing and communication. One of the most promising FlexIC technologies is based on thin film transistors (TFTs) incorporating metal oxide semiconductors. The high optical transmission of these devices has contributed to their development for displays, however the commercially feasible materials are presently all n-type semiconductors. This means that metal oxide-based FlexIC architectures cannot incorporate silicon-based circuit designs of the past three decades, which are almost exclusively based on complementary semiconductors (i.e. the circuits contain both n-type and p-type transistors). These CMOS circuits have enabled a degree of integration, efficiency and complexity that has so far been unachievable in any commercial unipolar (n-type or p-type) technologies. Certain aspects and embodiments of the present invention are concerned with the development of metal oxide-based FlexICs to enable low cost applications in processing, sensing, communication and other fields, and have therefore required a different approach.

In the past, unipolar integrated circuits (ICs) based on silicon have featured integrated resistors. However, typically these resistors had relatively low resistivity of up to ~50 k$\Omega$/□ (50 kOhm per square). This limited the economically viable (i.e. sufficiently small in IC footprint) resistor range. In turn, this limitation drove the development of circuit architectures using diode- or transistor-load transistors, which suffered from high power consumption and slow switching speeds in comparison to contemporary circuits based on bipolar transistors. Furthermore, these resistor technologies were applicable only to bulk crystalline semiconductors. Later IC processes featured thin film metal- or polysilicon-based resistors in 'back end of line' (BEOL) layers above the active devices. These resistors have even lower resistivity of up to around 100$\Omega$/□ (100 Ohm per square), however.

SUMMARY

Aspects and embodiments of the present invention aim to address at least one of the problems associated with the prior art. Furthermore, certain aspects and embodiments of the present invention address the problem of how to integrate resistors and transistors in electronic circuits, especially, but not exclusively, electronic circuits which are at least one of: capable of being produced in high volumes; capable of being produced at low cost; flexible; transparent; and have a small footprint. Certain aspects and embodiments of the present invention also aim to provide resistor geometries, technologies, materials, and methods of their manufacture, which are compatible with incorporation or integration with electronic circuits of any one or more of the above-mentioned types. Furthermore, certain aspects and embodiments of the present invention address the problem of how to manufacture circuits, especially flexible ICs, incorporating resistors, where the resistors have resistances in the desired ranges for their intended applications in the circuits, and yet the circuits have small footprints.

In accordance with a first aspect of the present invention there is provided an electronic circuit (or circuit module) (100) comprising a transistor (1) and a resistor (2), the transistor comprising a source terminal (11), a drain terminal (12), a gate terminal (13), and a first body (10) of material providing a controllable semiconductive channel between the source and drain terminals, the resistor comprising a first resistor terminal (21), a second resistor terminal (22), and a second body (20) of material providing a resistive current path between the first resistor terminal and the second resistor terminal, wherein said first body (10) of material comprises a metal oxide (e.g. comprises a first quantity of said metal oxide) and said second body (20) of material comprises said metal oxide (e.g. comprises a second quantity of said metal oxide).

Advantageously, as the semiconductive first body (channel body) 10 and the resistor body 20 are each formed from the same metal oxide, they may be formed, for example by deposition, in the same machine, for example without having to remove the circuit structure between forming the first quantity of metal oxide and the second. They may be formed sequentially, but under different conditions, the conditions being selected/arranged such that the first body is semiconductive and the second body is resistive, or vice versa. Alternatively, the metal oxide material of the first and second bodies may be formed at the same time as each other, for example in a single deposition step, with the difference in electrical properties being achieved by different doping and/or by different subsequent processing. Furthermore, a combination of different deposition conditions, different doping, and/or different subsequent processing may be used to achieve different electrical properties of the bodies based on the same metal oxide material.

In certain embodiments, the circuit comprises first and second voltage (supply) rails (61, 62), the resistor is a load resistor connected in series between one of the source and drain terminals (11, 12 and one of said voltage (supply) rails.

In certain embodiments, the second body (20) of material comprises a dopant. In certain such embodiments, the first body (10) of material does not comprise said dopant, and this difference contributes at least in part to the different electrical properties of the two bodies.

In certain alternative embodiments, first body (10) of material comprises a dopant in a first range of concentrations, and said second body (20) of material comprises said dopant in a second range of concentrations. In certain such embodiments the second range is higher than said first range, and in others the second range is lower than said first range.

In certain embodiments, at least a portion of the second body (20) has been processed (e.g. annealed, laser annealed, thermally annealed, exposed to electromagnetic radiation, doped, implanted, exposed to a flux of ions) to increase (or decrease) its conductivity.

In certain embodiments, each of the first and second bodies (10, 20) comprises a respective layer, film, or sheet of said metal oxide. In certain such embodiments, each said layer, film, or sheet has a thickness in the range 1 to 200 nm (for example in the range 5 to 50 nm).

In certain embodiments, each said layer, film, or sheet has the same thickness.

In certain embodiments, each said layer, film, or sheet is flat (planar). In certain such embodiments, the first and second bodies are coplanar, although in certain alternative embodiments the first body lies in a first plane and the second body lies in a second plane, the second plane being parallel to said first plane.

In certain embodiments, the second body has a sheet resistance value in the range 25 kOhm/sq to 20 MOhm/sq (e.g. in the range 50 kOhm/sq to 10 MOhm/sq). Advantageously, this enables resistors having resistances in the ranges desired for a wide variety of applications to be manufactured, whilst having relatively small/compact footprints. In other words, the areas of resistive material required may be suitably small.

In certain embodiments, each of the first and second bodies is substantially transparent to electromagnetic radiation in the range visible to the naked human eye.

In certain embodiments, the circuit (or circuit module) comprises a substrate (5) arranged to support, directly or indirectly, each of the transistor (1) and the resistor (2). In certain embodiments the substrate is flexible, as indeed may be the circuit itself.

In certain embodiments, the metal oxide is Indium Gallium Zinc Oxide, IGZO.

In certain embodiments the resistor (2) exhibits a resistance between its terminals (21, 22) in the range 10 ohm to 10 MOhm (for example 100 ohm or 1 kOhm to 1 or 10 MOhm) at room temperature.

In certain embodiments, the circuit further comprises a second resistor (3) comprising first and second terminals (31, 32) and a third body (30) of material providing a resistive current path between said terminals, wherein said third body of material comprises said metal oxide (e.g. comprises a third quantity of said metal oxide). In certain such embodiments, each of the second and third bodies is flat (planar), wherein the second body lies in a second plane and the third body lies in a third plane, said third plane being parallel to said second plane.

In certain embodiments, the first and second resistors exhibit different resistances at room temperature. For example, the second body of material may comprise a dopant in a second range of concentrations, and said third body of material may comprise said dopant in a third range of concentrations, said second range being different from said third range. Additionally, or alternatively, the third body (30) may have been processed differently from said second body to achieve the different resistances.

Another aspect of the present invention provides a method of manufacturing an electronic circuit (or circuit module) (100) comprising a transistor (1) and a resistor (2), the transistor comprising a source terminal (11), a drain terminal (12), a gate terminal (13), and a first body (10) of material providing a controllable semiconductive channel between the source and drain terminals, and the resistor comprising a first resistor terminal (21), a second resistor terminal (22), and a second body (20) of material providing a resistive current path between the first resistor terminal and the second resistor terminal, the method comprising: forming the first body (10); and forming the second body (20), wherein the first body comprises a first quantity (100) of a metal oxide and the second body comprises a second quantity (200) of said metal oxide.

In certain embodiments forming the first body comprises forming said first quantity of said metal oxide, and forming the second body comprises forming said second quantity of said metal oxide.

In certain embodiments forming said first quantity comprises forming said first quantity (100) directly or indirectly on a first region (51) of a substrate, and forming said second quantity comprises forming said second quantity (200) directly or indirectly on a second region (52) of the substrate.

In certain embodiments, said forming of said first quantity comprises forming said first quantity (100) using a technique selected from a list comprising: physical deposition; physical vapour deposition (PVD); chemical deposition; chemical vapour deposition (CVD); atomic layer deposition (ALD); physical-chemical deposition; evaporation; sputtering; sol-gel techniques; chemical bath deposition; spray pyrolysis; plating techniques; pulsed laser deposition (PLD); solution processing; and spin coating.

In certain embodiments, said forming of said second quantity comprises forming said second quantity (200) using a technique selected from a list comprising: physical deposition; physical vapour deposition (PVD); chemical deposition; chemical vapour deposition (CVD); atomic layer deposition (ALD); physical-chemical deposition; evaporation; sputtering; sol-gel techniques; chemical bath deposition; spray pyrolysis; plating techniques; pulsed laser deposition (PLO); solution processing; and spin coating.

In certain embodiments, forming said first quantity comprises depositing said first quantity of said metal oxide.

In certain embodiments forming said second quantity comprises depositing said second quantity of said metal oxide.

In certain embodiments, said forming of said first quantity is performed before said forming of said second quantity.

In certain embodiments, said forming of said first quantity is performed after said forming of said second quantity.

In certain embodiments, said forming of said first quantity comprises forming (e.g. by depositing or otherwise forming) a first layer, film, or sheet (1001) of said metal oxide, said first layer, film, or sheet comprising said first quantity (100).

In certain embodiments, forming the first body (10) comprises patterning the first layer, film, or sheet (1001).

In certain embodiments, forming of said second quantity comprises forming (e.g, by depositing or otherwise forming) a second layer, film, or sheet (2001) of said metal oxide, said second layer, film, or sheet comprising said second quantity (200).

In certain embodiments, forming the second body (2) comprises patterning the second layer, film, or sheet (2001).

In certain embodiments, said forming of said first quantity (100) is performed at the same time as forming said second quantity (200).

In certain embodiments, said forming of said first quantity at the same time as forming said second quantity comprises forming (e.g. by depositing or otherwise forming) a layer, film, or sheet (1200) of said metal oxide, said layer, film, or sheet (1200) comprising said first and second quantities (100, 200).

In certain embodiments, forming the first and second bodies (10, 20) comprises patterning said sheet (1200).

In certain embodiments, the method further comprises doping said first body (10) of material with a first dopant to decrease (or increase) an electrical conductivity of said first body.

In certain embodiments, doping said first body of material comprises forming said first quantity (100) on a source (71) of said first dopant.

In certain embodiments, the method comprises providing said source (71) of said first dopant directly or indirectly on said first region (51) of the substrate.

In certain embodiments, doping said first body of material comprises forming a source of said first dopant on said first body of material.

In certain embodiments, the method further comprises doping said second body (20) of material with a second dopant to increase (or decrease) an electrical conductivity of said second body.

In certain embodiments, doping said second body of material comprises forming said second quantity (200) on a source (72) of said second dopant.

In certain embodiments, the method further comprises providing said source (72) of said second dopant directly or indirectly on said second region (52) of the substrate.

In certain embodiments, doping said second body of material comprises forming a source of said second dopant on said second body of material.

In certain embodiments, the method further comprises processing said second quantity (200) of said metal oxide to increase or decrease an electrical conductivity of the second body.

In certain embodiments, processing said second quantity comprises annealing (or otherwise processing) at least a portion of said second quantity to increase or decrease its conductivity.

In certain embodiments, said processing of the second body (e.g, by annealing, or other means) comprises exposing said at least a portion to electromagnetic radiation.

In certain embodiments, the method further comprises providing said electromagnetic radiation from a lamp. In certain other embodiments, the electromagnetic radiation may be provided from a laser.

In certain embodiments, the method further comprises shielding at least a portion of the first quantity (100) of said metal oxide from said electromagnetic radiation.

In certain embodiments, said shielding comprises using said gate terminal (13) to shield said at least a portion of the first quantity (100) from said electromagnetic radiation.

In certain embodiments, each of the first and second bodies (10, 20) comprises a respective layer, film, or sheet of said metal oxide, and each said respective layer, film, or sheet may have a thickness in the range 1 to 200 nm (for example 5 to 50 nm).

In certain embodiments, each said respective layer, film, or sheet has the same thickness.

In certain embodiments, each said respective layer, film, or sheet is flat (planar).

In certain embodiments, the method comprises forming the first and second bodies (10, 20) in a common plane.

In certain embodiments, the method comprises forming the first body in a first plane and forming the second body in a second plane, said second plane being parallel to said first plane.

In certain embodiments, the second body has a sheet resistance value in the range 25 kOhm/sq to 20 MOhm/sq (e.g. in the range 50 kOhm/sq to 10 MOhm/sq).

In certain embodiments, each of the first and second bodies is substantially transparent to electromagnetic radiation in the range visible to the naked human eye.

In certain embodiments, the method further comprises providing a substrate (5) arranged to support, directly or indirectly, each of the transistor and the resistor, and said forming of the first and second bodies comprises forming the first body (10) on or over a first region (51) of the substrate and forming the second body (20) on or over a second region (52) of the substrate.

In certain embodiments, said substrate (5) is flexible.

In certain embodiments, the method further comprises forming the source terminal, drain terminal, first resistor terminal, and second resistor terminal after forming the first and second bodies. In certain alternative embodiments, the method further comprises forming the source terminal, drain terminal, first resistor terminal, and second resistor terminal before forming the first and second bodies, for example to form bottom contact devices.

In certain embodiments, said metal oxide is Indium Gallium Zinc Oxide, IGZO.

In certain embodiments, said resistor exhibits a resistance between its terminals in the range 10 ohm to 10 MOhm (for example 100 ohm or 1 kOhm to 1 or 10 MOhm) at room temperature.

In certain embodiments, the circuit further comprises a second resistor (3) having first and second terminals (31, 32) and a third body (30) of material providing a resistive current path between said terminals, the method comprising forming said third body (30) of material, said third body comprising a third quantity (300) of said metal oxide. The second resistor may, for example, be in a different layer of the circuit from the first resistor.

In certain embodiments, the method further comprises doping or processing said third body differently from said second body, such that the first and second resistors exhibit different resistances at room temperature. For example, one of the resistor bodies may be shielded from exposure to irradiation (e.g. UV irradiation), whilst the other is unshielded and hence receives UV irradiation and as a result has its conductivity increased or decreased.

In certain embodiments, said resistor is a load resistor connected in series between one of the source and drain terminals and a voltage (supply) rail.

In certain embodiments, the electronic circuit is flexible.

Another aspect of the present invention provides a resistor comprising a first resistor terminal (21), a second resistor terminal (22), and a body (20) of material providing a resistive current path between the first resistor terminal and the second resistor terminal, wherein the body (20) covers at least part of an upper surface of the first resistor terminal (21), and the second resistor terminal (22) covers at least a portion of a top surface of the second body (20). In other words, the body (20) may at least partially overlap the first resistor terminal (21), and the second resistor terminal (22) may at least partially overlap the second body. The resistor may be formed on a substrate, or some other supporting body or structure, and the body (20) may comprise a quantity of a metal oxide material.

Another aspect of the present invention provides a method of manufacturing a resistor comprising a first resistor terminal (21), a second resistor terminal (22), and a body (20) of material providing a resistive current path between the first resistor terminal and the second resistor terminal, the method comprising: forming the body, then forming the first resistor terminal, and then forming the second resistor terminal. In an alternative aspect, the method comprises:

forming the first resistor terminal (21), then forming the body (20), and then forming the second resistor terminal (22). In a further aspect, the method comprises: forming the first resistor terminal (21), then forming the second resistor terminal (22), and then forming the body (20). Thus, the resistor terminals are not formed at the same time (or in the same processing step or sequence of steps) as each other.

Further aspects of the invention provide a resistor as defined in connection with any one of the above-mentioned aspects or embodiments, and a method of manufacturing such a resistor.

In certain embodiments of any aspect of the present invention, at least one of the bodies of material comprising a metal oxide may be formed so as to be initially semi-conductive material, in a "normally off" condition (e.g. enhancement mode, n-type or p-type). For such materials, since their conductivities are initially very low (because they are in the "off" state), processing arranged to increase their conductivities may be employed in order to change their electrical characteristics to resistive.

In certain embodiments of any aspect of the present invention, at least one of the bodies of material comprising a metal oxide may be formed so as to be initially semi-conductive material, in a "normally on" condition (e.g. depletion mode, n-type or p-type). For such materials, since their conductivities are initially relatively high (because they are in the "on" state), processing arranged to decrease their conductivities may be employed in order to change their electrical characteristics to resistive.

In certain embodiments, exposure to electromagnetic (e.g. optical) radiation may be employed to increase the conductivity of at least part of at least one of the quantities of (or at least one of the bodies comprising) metal oxide. For example, "normally off" semiconductive material (e.g. SnO with a negative threshold voltage) may be exposed to radiation to change its characteristics to being substantially resistive. NiO can be tuned from p-type to n-type with an increase in conductivity.

In certain embodiments, exposure to electromagnetic (e.g. optical) radiation may be employed to decrease (reduce) the conductivity of at least part of at least one of the quantities of (or at least one of the bodies comprising) metal oxide. For example, one may change from n-type material (e.g. SnO2) to p-type material (e.g. SnO) using H2 annealing to reduce the Sn(IV). Exposure to optical radiation may be used on a semiconductor that is "normally on", e.g. for devices that are p-type with a positive threshold voltage. That semiconductor will have a relative high conductivity initially, and the radiation may be arranged to reduce that conductivity, making the material substantially resistive (thus providing a route to integrating resistors in a p-type process in certain embodiments. This reduction in conductivity (to produce a resistor) may also be achieved by reducing the number of holes, e.g. with hydrogen.

In certain embodiments, exposure to electromagnetic radiation (optical excitation) may generate carriers (typically to increase conductivity rather than reduce it). Beside optical excitation, and for example with a dielectric layer present, laser ablation of a semi-conductive film (or other body comprising a quantity of metal oxide material) may be possible to reduce thickness of the semi-conductive material and therefore reduce its conductivity.

Other than optical processes, in certain embodiments, opening a window in a dielectric layer covering a semi-conductive body (e.g. layer) allows introduction of extrinsic dopants and/or modification to the metal oxide material by various means, to change its conductivity. In certain embodiments, without opening a window, the dielectric layer itself can be engineered (e.g. by reducing thickness, arranging/altering composition, etc.) to promote species diffusion to an underlying or overlying body of semi-conductive material to reduce (or increase) the conductivity of that body.

BRIEF DESCRIPTION OF THE DRAWINGS

Aspects and embodiments of the present invention will now be described with reference to the accompanying drawings, of which;

FIGS. 7A-7B and 8A-8B illustrate steps in two other methods embodying the invention;

DETAILED DESCRIPTION

Figure 1:
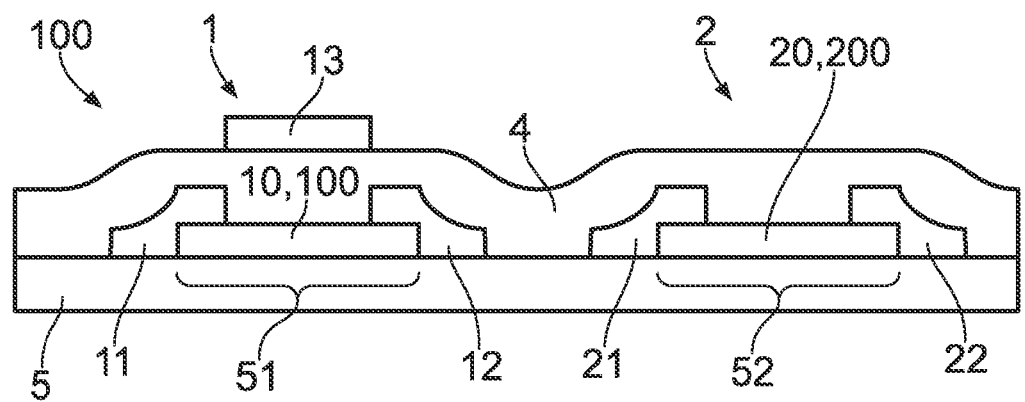
FIG. 1 is a schematic cross-section of part of an electronic circuit embodying the invention.

Referring now to FIG. 1, this illustrates part of an electronic circuit embodying the present invention. Typically, of course, the electronic circuit will comprise numerous other components, and the interconnections between those components. However, for clarity and simplicity the figure only illustrates one transistor (1) and one resistor (2) of the circuit (which may also be referred to as a circuit module). The transistor (1) is a field effect transistor, FET, comprising a source terminal (11), a drain terminal (12), a gate terminal (13), and a first body (10) of material providing a controllable semi-conductive channel between the source and drain terminals. As will be well appreciated, the conductivity of the channel is controlled by application of suitable voltages to the gate terminal (13). The resistor (2) comprises a first resistor terminal (21), a second resistor terminal (22), and a second body (20) of material providing a resistive current path between the first resistor terminal and the second resistor terminal. Although the source and drain terminals (11, 12) and resistor terminals (21, 22) are shown in the 'top contact' architecture in this embodiment, i.e. partly overlying the end portions of the first body (10) and second body (20), other embodiments of the invention include circuits employing alternative terminal architectures. Furthermore, although the FET shown is of the 'top gate' architecture, with the gate terminal (13) positioned above the first body (10), other embodiments of the invention include circuits employing alternative FET architectures. The first body (10) of material comprises a first quantity of a metal oxide, and the second body (20) comprises a second quantity of the same metal oxide. Thus, unlike circuits known from the prior art, the circuit comprises a semiconductor channel and a resistor each formed from the same metal oxide. This enables considerable cost and/or time savings during manufacture, as the number of materials and methods used to form, pattern and define the circuit may be minimised. The first quantity (100) of metal oxide, forming the first body (10), has been formed on a first region (51) of a substrate (5) which supports at least the transistor and resistor of the circuit. The first body (10) can thus be regarded as having been formed on or over a first region of a surface of the substrate (5). The second quantity (200) of the metal oxide has been formed over a second region (52) of the substrate surface. The figure also illustrates a layer or body of dielectric material (4) which has been formed over the first and second bodies (10, 20), the source and drain terminals and the resistor terminals, and which provides the gate dielectric of the transistor (1). The gate terminal (13) has then been formed over the layer of dielectric material (4).

Although the embodiment of FIG. 1 shows the first and second bodies (10, 20) each comprising the same metal oxide, the two quantities (100, 200) of metal oxide material have been deposited under different conditions such that the first body (10) exhibits substantially semi-conductive behaviour, whereas the second body (20) exhibits substantially resistive behaviour. It will be appreciated that this difference in electrical/electronic properties can be achieved in a number of ways. For example, one of the quantities (100, 200) of metal oxide material may be deposited using a PVD technique in the presence of oxygen, whereas the other may be deposited by PVD not in an oxygen-containing environment. Alternatively, the different electrical/electronic properties of the first and second bodies (10, 20) may be achieved by processing the first and second quantities (100, 200) differently, after their initial formation/deposition stage, and such processing techniques will be described below. However, the embodiments of the invention are linked by the novel concept of the transistor channel and resistor body both comprising the same metal oxide material. In certain embodiments the transistor may be N-type (enhancement or depletion mode), whilst in others it may be P-type (enhancement or depletion mode). In certain embodiments the transistor channel and resistor body both comprise, in place of the metal oxide material, an organic material such as a polymer, a compound semiconductor, a 2D material such as graphene, or a perovskite.

Figure 2:
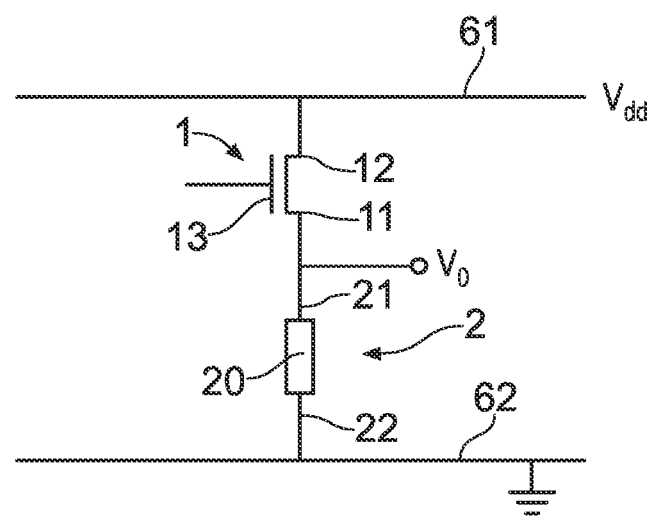
FIG. 2 is a diagram of an inverter circuit embodying the invention.

In certain embodiments, the resistor (2) may be a load resistor, connected in series between one of the source and drain terminals and a voltage rail. FIG. 2 shows one such arrangement. Here the circuit module (100) is a PMOS inverter (which may also be described as a NOT gate) with a resistive load. The resistor (2) is connected in series between the transistor source (11) and a lower voltage rail (62), which is connected to ground. The drain terminal of the transistor (12) is connected to the high voltage rail (61) (Vdd).

Figure 3:
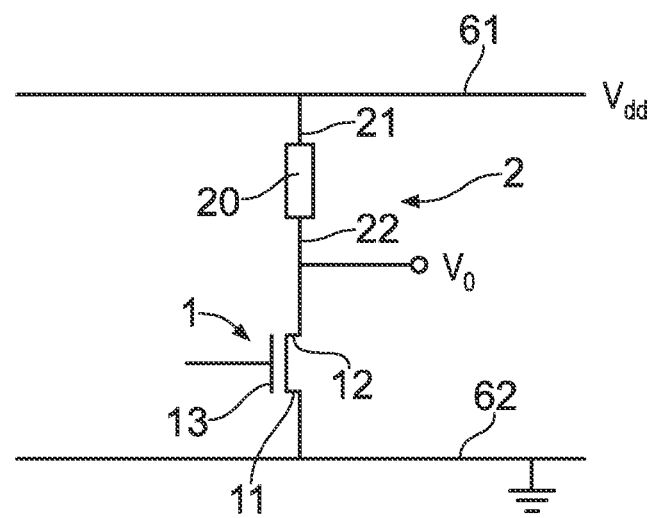
FIG. 3 is a diagram of another inverter circuit embodying the present invention.

FIG. 3 illustrates another circuit module embodying the invention, where the resistor (2) is connected on the high side of the transistor, in series between voltage rail (61) and the drain terminal (12) of the transistor (1). This circuit can be described as an NMOS inverter circuit or circuit module, or equivalently a NOT gate with resistive load.

Figure 4:
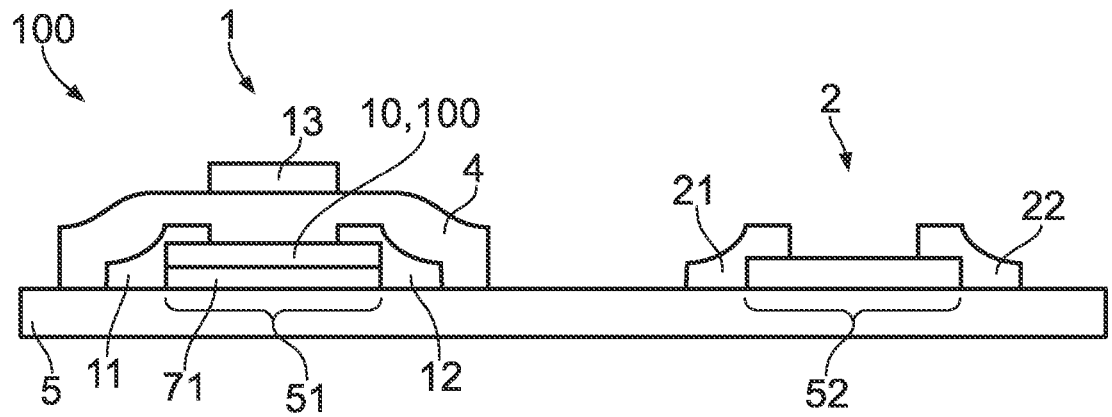
FIGS. 4 and 5 are schematic cross-sections of parts of two other electronic circuits embodying the invention.

Referring now to FIG. 4, this illustrates a circuit module in accordance with another embodiment, where the difference in electrical/electronic properties of the first and second bodies (10, 20) has been achieved, at least in part, by depositing the first quantity (100) of metal oxide material on a source of a first dopant (71) which has been formed on a first region (51) of the substrate (5) the source of dopant (71) is arranged such that the first quantity (100) of metal oxide material may be deposited as a resistive layer, with the pre-patterned dopant selectively causing the resistive layer deposited on top of it to become semi-conductive. The second quantity of metal oxide material (200) has been deposited as a resistive layer on a second region (52) of the substrate (5) where no dopant source is present. Thus, this second quantity (200) remains resistive, rather than being converted to semi-conductive.

Figure 5:
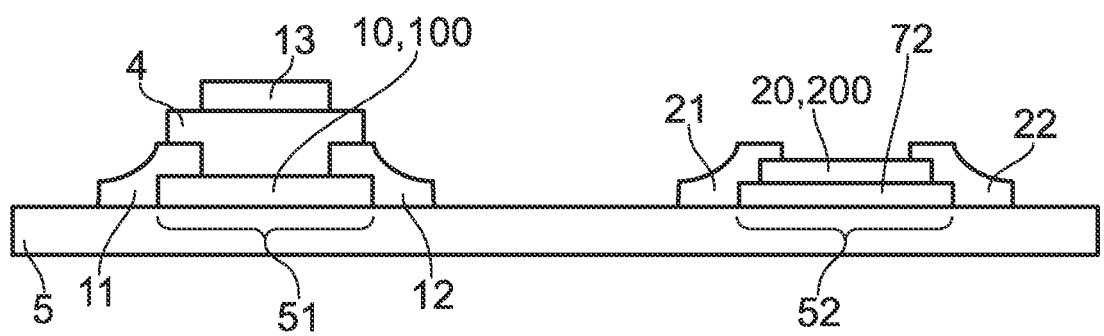

Referring now to FIG. 5, this shows an alternative embodiment in which a source of a second dopant (72) has been selectively provided over a second region (52) of the substrate (5). The first and second quantities (100, 200) of metal oxide material have each been deposited initially as semi-conductive layers. However, the source of the second dopant (72) has been selected such that the dopant interacts with the second quantity (200) to change its electrical properties from substantially semi-conductive to substantially resistive, and so results in the second body (20) being resistive, whereas the first body (10) remains semi-conductive, and forms the channel of the transistor (1).

Although the examples discussed above in reference to FIGS. 4 and 5 comprise a source of dopant (71, 52) beneath the semiconducting and/or resistive bodies (10, 20), a source of dopant may instead, or additionally, be provided above or to the side of one or both of those bodies. For example, a dielectric layer (4) may be a source of dopant, and/or the source and drain terminals (11, 12) and/or resistor terminals (21, 22) may be a source of dopant. The source of dopant may remain in the final circuit structure or it may be removed during processing. For example a conductive layer used to form the source and drain terminals (11, 12) and/or resistor terminals (21, 22) may be a source of dopant, and doping of the semiconducting and/or resistive bodies (10, 20) may be achieved prior to partial removal of the conductive layer during formation of the terminals, for example by patterning and etching.

It will be appreciated that whilst selective doping of the deposited quantities of metal oxide material may be used to achieve their different electrical properties, this technique may also be used in conjunction with depositing the first and second quantities (100, 200) under different conditions in certain embodiments. However, in other embodiments, the first and second quantities (100, 200) may be deposited under the same conditions, and their different electrical properties may be achieved wholly by their different subsequent processing.

Figure 6:
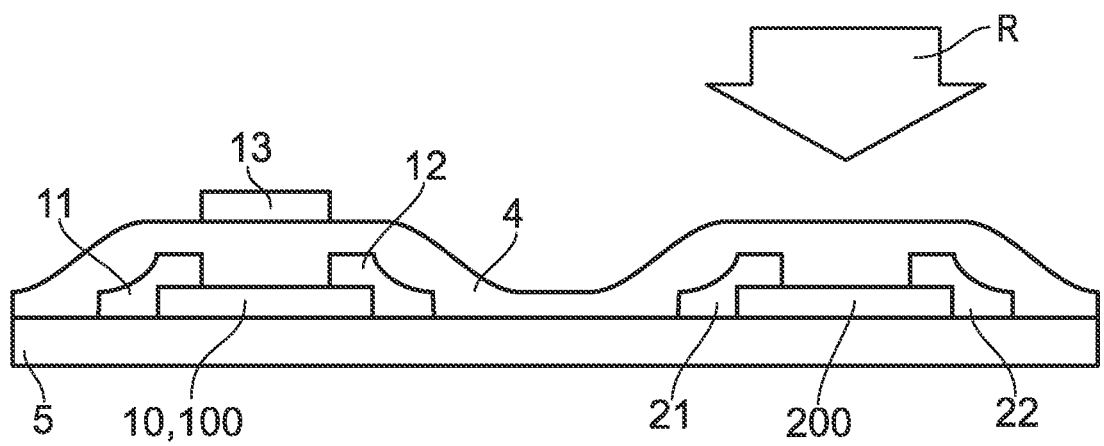
FIG. 6 illustrates a step in the manufacture of another electronic circuit embodying the invention.

Referring now to FIG. 6, this illustrates a step in the manufacture of another electronic circuit module embodying the invention, Here, the structures of the transistor (1) and resistor (2) have been formed, initially by depositing the first and second quantities (100, 200) of metal oxide material on respective portions of a surface of the substrate (5). These first and second quantities (100, 200) are initially semi-conductive. They may, for example, be formed such that they are initially in a semiconductive "normally off" state (i.e. having low conductivity). However, the step illustrated in FIG. 6 is one in which the second quantity (200) of material is being selectively exposed to electro-magnetic radiation to change its conductivity. For example, the electro-magnetic radiation may be arranged so as to anneal at least a portion of the second quantity of material, and increase its electrical conductivity (e.g. relative to the low conductivity "off" state) such that it provides a resistive, rather than semi-conductive, path between its terminals. It will be appreciated that this selective exposure of just one of the bodies of metal oxide material (100, 200) may be achieved in a variety of ways. For example, radiation may be directed on to a wide portion of the circuit, with the gate terminal (13) acting as a mask to shield the first quantity of metal oxide material (100) (or at least a substantial part of it) from the effects of the radiation. Alternatively, a separate mask may be used, and/or a source of electro-magnetic radiation may be used which is able to illuminate just a small part of the circuit (for example a laser beam may be used to perform the selective annealing/processing). Techniques suitable for use in certain embodiments, to increase the conductivity of one or more of the bodies, are described in U.S. Pat. No. 10,204,683B2.

Referring now to FIG. 7, this shows two steps in another method embodying the invention. In this method, the first (100) and second (200) quantities of the metal oxide material have been deposited on separate regions of the substrate (5), and initially both are semi-conductive. For example, the first and second quantities may be formed so as to be semi-conductive, in a "normally off" condition (e.g. for IGZO devices that are n-type enhancement mode/positive threshold voltage). For such materials, since their conductivities are initially very low (because they are in the "off" state), processing arranged to increase their conductivities would be needed in order to change their electrical characteristics to resistive). The quantities of metal oxide material may, in certain embodiments, be formed as p-type "normally off" material, e.g. in SnO with a negative threshold voltage. NiO can also be tuned from p-type to n-type with an increase in conductivity. In alternative embodiments, the quantities of metal oxide material may be formed so as to be semi-conductive, in a "normally on" state (e.g. for devices that are p-type with a positive threshold voltage). For such materials, since their conductivities are initially relatively high (because they are in the "on" state), processing arranged to decrease their conductivities would be needed in order to change their electrical characteristics to resistive). Returning to the current embodiment, it will be appreciated that the separate quantities (100, 200) shown in FIG. 7a may be produced by first depositing a uniform layer, sheet, or other structure of metal oxide material, and then patterning it by any suitable means. Alternatively, the separate quantities (100, 200) may be selectively formed by any suitable technique on the substrates surface (for example by selective deposition, coating, printing, or otherwise). In the step illustrated in FIG. 7a, the second quantity (200) of metal oxide material is being selectively exposed to electro-magnetic radiation so as to increase its conductivity, and change its electrical characteristics from being substantially semi-conductive ("normally off" semi-conductive material) to being resistive. After this exposure, which can generally be regarded as processing the second quantity (200) of metal oxide material differently from the first quantity (100), we have the structure shown in FIG. 7b, where a semi-conductive body (10) of the metal oxide occupies one portion of the substrate surface, and the second body (20) of the substantially resistive metal oxide material occupies another portion. It will be appreciated that the terminal/contacts of the transistor and resistor may then be built up by suitable processing techniques, and the gate dielectric and gate terminal can also be formed. Thus, the method illustrated in FIG. 7 is one in which the first and second quantities (100, 200) of metal oxide material are processed differently before the remainder of the transistor and resistor are formed (in contrast to the method illustrated in FIG. 6, where that different processing is performed after the formation of the transistor and resistor structures).

Referring now to FIG. 8, this shows two steps in an alternative method embodying the invention. Here, in FIG. 8a, an initially uniform layer of semi-conductive material (1200) has been formed to cover an open surface of the substrate (5). Separate portions of that layer (1200) provide the first and second quantities (100, 200) of metal oxide material. FIG. 8a also illustrates that the second quantity (200) of metal oxide is being selectively exposed to electro-magnetic radiation to change its conductivity (for example to increase its conductivity, and hence decrease its resistivity, or decrease its conductivity and increase its resistivity). It will be appreciated that this selective exposure may be performed by a variety of suitable techniques, as will be apparent to the skilled person from their general knowledge in this field, as well as from the remainder of this specification. Thus, in this example the selective processing of the second quantity (200) of metal oxide is performed before the layer (1200) is patterned. FIG. 8b shows the structure resulting from patterning the layer (1200), by selectively removing portions of it to expose underlying portions of the substrate (5) surface. In particular, metal oxide material has been removed to leave just the first and second bodies (10, 20). The first body (10) corresponds to the first quantity (100) of metal oxide, as deposited as part of the initial layer (1200). The second body (20) comprises the second quantity (1200), which has also been exposed to electro-magnetic radiation, and is now resistive rather than semi-conductive. Again, after the two steps shown in FIG. 8, the further features of the transistor and resistor will be built up by suitable techniques.

Figure 9:
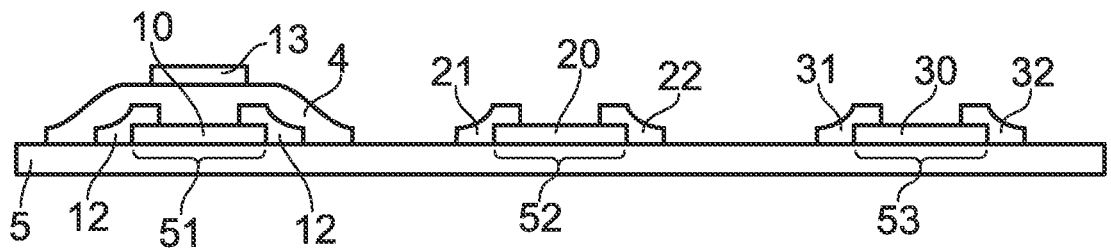
FIG. 9 is a schematic cross-section of part of another electronic circuit embodying the present invention, incorporating a transistor and two resistors.

Referring now to FIG. 9, this illustrates another circuit module embodying the invention. This circuit module comprises a transistor (1), a first resistor (2), and a second resistor (3). The transistor channel is provided by a first body of metal oxide material (10) formed on the first region (51) of the substrate (5). The first resistor (2) comprises a resistive body (20), formed on a second region (52) of the substrate, and the second resistor (3) comprises a third body (30) of the same metal oxide material as that forming the first and second bodies (10, 20), this third body (30) being formed on a third portion of the substrate (53). The second resistor also includes resistor terminals (31 and 32). In this embodiment, each of the first, second, and third bodies (10, 20, 30) is formed from the same metal oxide material. However, the first body (10) has been deposited under different conditions than the second body (20), so that the first body (10) is substantially semi-conductive, and the second body (20) is substantially resistive. In certain embodiments, the third body (30) may have been deposited under the same conditions as the second body (20), and may thus have the same sheet resistance. However, the geometries of the first and second resistors (2, 3) may be different such that the first and second resistors exhibit different resistances from each other. In alternative embodiments, however, the second and third bodies (20, 30) may be deposited under different conditions such that the sheet resistances of their resistive bodies (20, 30) may be different. Thus, different resistances may be achieved even though the geometries of the first and second resistors are not necessarily different from each other. Clearly, in yet further embodiments, a combination of different resistor geometries (e.g. different resistive path lengths and widths) may be employed in addition to different deposition techniques to yield resistors having different values in the electronic circuit.

Figure 10:
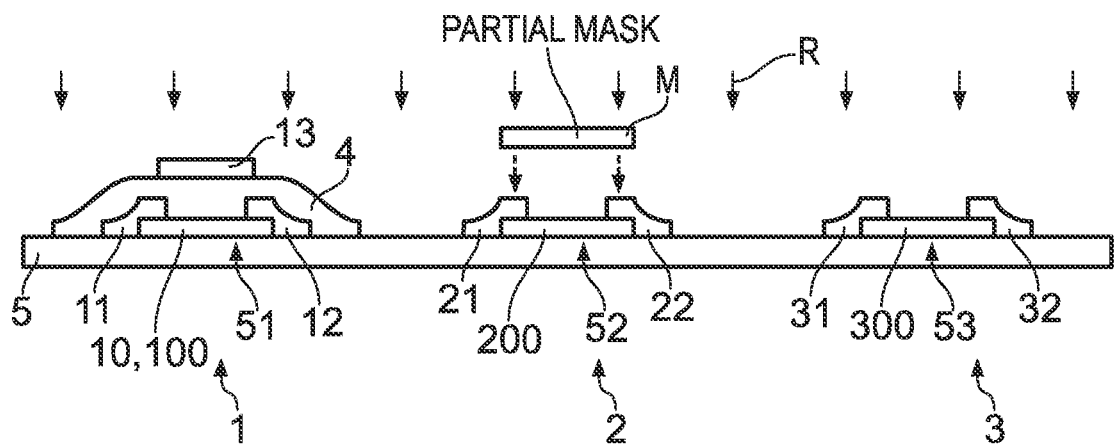
FIG. 10 illustrates a step in the manufacture of another electronic circuit embodying the invention.

Referring now to FIG. 10, this illustrates the step in the formation of another circuit module embodying the invention. In this embodiment, the circuit module again comprises a transistor (1) and first and second resistors (2, 3) formed on a common substrate (5). The transistor (1) comprises a semi-conductive channel provided by a first quantity (100) of metal oxide material. This first quantity (100) has been deposited at the same time as depositing second and third quantities (200, 300) of the metal oxide material under the same conditions. The conditions have been selected such that these first, second, and third quantities (100, 200, 300) are each initially semi-conductive. FIG. 10 illustrates a step in which conductivities of the second and third quantities (200, 300) are changed, whereas the conductivity of the first quantity (100) remains as initially deposited. In particular, electro-magnetic radiation (labelled R) is being directed at the illustrated structure, and the gate terminal (13) acts as a mask to shield the first quantity (100) of metal oxide material from that radiation and its effects. In contrast, the third quantity (300) is fully exposed to the radiation R, is annealed (or otherwise affected) by exposure to that radiation, and hence the initially semi-conductive (e.g, normally off) material of that third quantity (300) is converted to resistive material (by having its conductivity increased). The figure also shows a partial mask being used to absorb just a portion of the radiation directed towards the second quantity (200) of metal oxide material. In other words, the partial mask partially shields the second quantity of material (200) from the radiation R. Thus, the second quantity (200) of metal oxide is annealed (or otherwise affected) to a lesser extent than the third quantity (300), and hence sees a correspondingly smaller, but still significant, increase in its conductivity. Thus, the techniques illustrated in FIG. 10 are able to yield a circuit module with a semi-conductive transistor channel, and first and second resistors having different resistances, all being formed from the same metal oxide material, but processed differently to yield different electrical properties.

Figure 11:
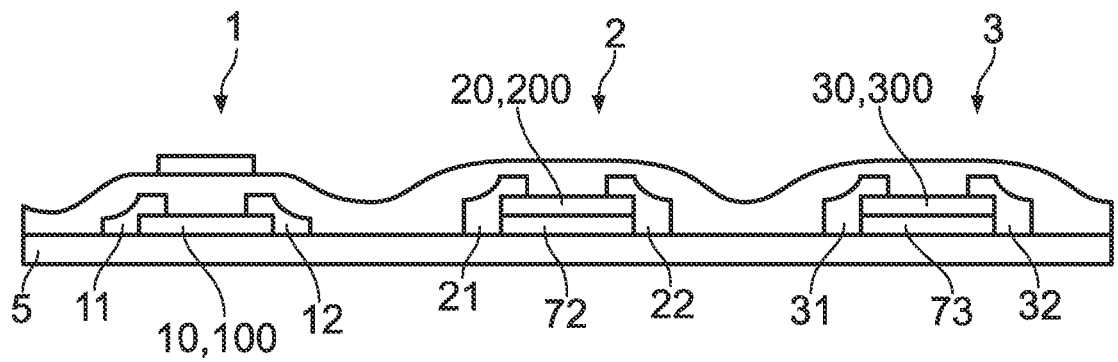
FIG. 11 is a schematic cross-section of another embodiment of the invention.
Figure 12A:
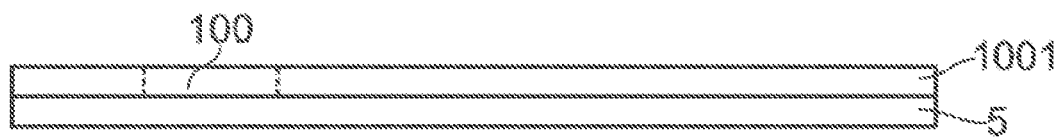
FIGS. 12A-12H illustrate steps in the method of manufacturing another electronic circuit embodying the invention.
Figure 12B:
Figure 12C:
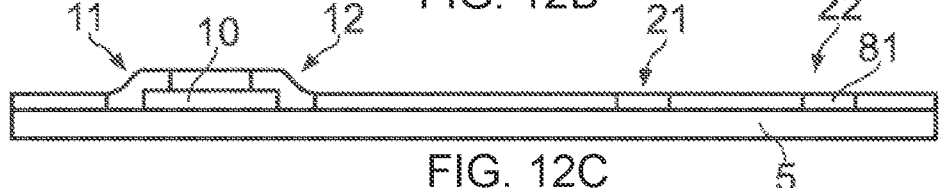
Figure 12D:
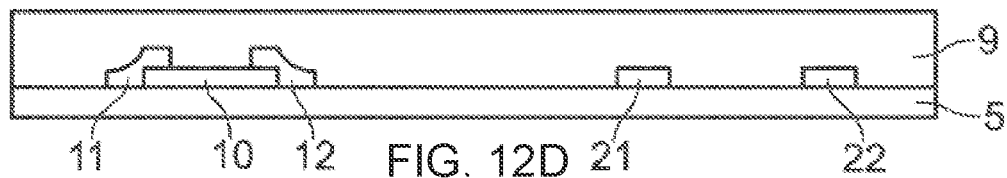
Figure 12E:
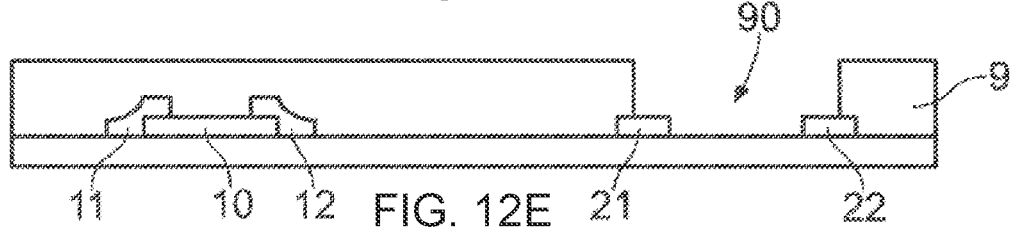
Figure 12F:
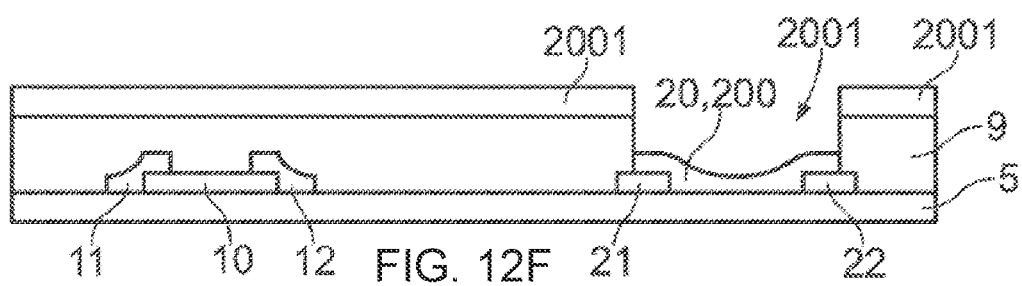
Figure 12G:
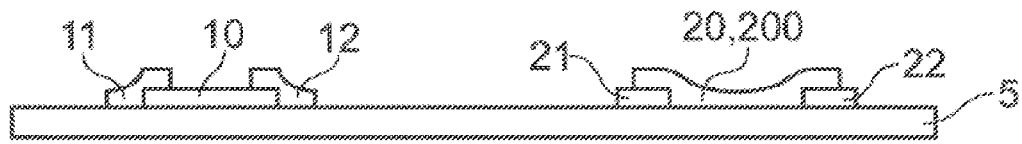
Figure 12H:
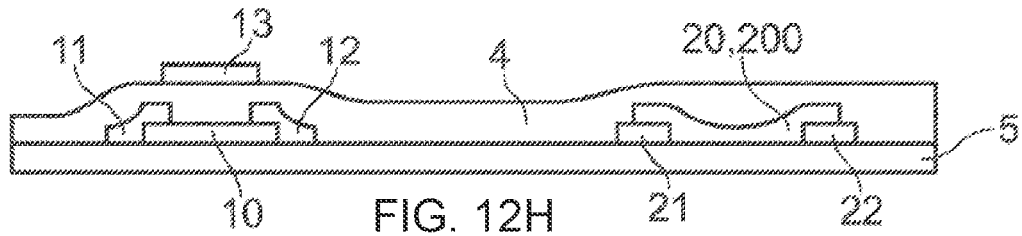

Referring now to FIG. 11, this shows another embodiment incorporating a transistor (1) and first and second resistors (2, 3). In this example, the semi-conductor channel (10) and the second and third resistor bodies (20, 30) have all been deposited at the same time from the same metal oxide material under the same deposition conditions, such that the first, second, and third quantities (100, 200, 300) of metal oxide material are each initially semi-conductive. However, the second quantity (200) has been formed on a second dopant source (72), and the third quantity (300) has been formed on a third dopant source (73). The dopant materials and/or their concentrations have been selected such that they result in the second and third bodies (20, 30) being differently doped, and hence exhibiting different resistances. No dopant is provided to the first quantity of metal oxide material, which accordingly simply provides the first body (10) of the transistor (1).

Referring now to FIG. 12, this shows steps in another method embodying the invention in which the first and second quantities (100) of metal oxide material are deposited at different stages in the manufacturing method, and under different conditions to achieve different conductivities of the bodies (10, 20) formed from the same metal oxide material. FIG. 12a shows how an initial layer (1001) of metal oxide material has been formed over a substrate (5), which in certain embodiments is flexible, and in alternative embodiments is rigid. The substantially uniform layer (1001) comprises the first quantity (100) of metal oxide material that will form the basis of the channel of the transistor. The structure shown in FIG. 12a is then patterned by suitable means to yield the structure shown in FIG. 12b. Thus, portions of the layer (1001) have been selectively removed to leave just the first quantity (100) of metal oxide material that will form the first body (10). It will be appreciated that a wide variety of techniques may be used to perform this patterning, for example techniques involving one or more of the following: lithography, photolithography, imprinting, nano-imprinting. In the illustrated method, a layer of conductive material (81) is then formed over the first body (10) and substrate (5). Using suitable techniques, that conductive layer (81) is patterned to form the source and drain terminals (11 and 12) and first and second terminals (21, 22) of the resistor. A layer of resist material (9) is then formed over the terminals/contacts and semi-conductive channel, to yield the structure shown in FIG. 12d. Again, by using suitable techniques, a window (90) is formed in the resist layer (9), exposing at least part of the resistor terminals (21, 22) and a portion of the substrate surface extending between them. Then, FIG. 12f illustrates the formation (by deposition or otherwise) of a second layer (2001) of the same metal oxide material as the first layer (1001), but under different conditions such that the second layer (2001) exhibits resistive behaviour rather than semi-conductive behaviour. This second layer (2001) includes the second quantity (200) of metal oxide material, which forms the second body (20) of the resistor, providing a resistive path between the resistor terminals (21, 22). Thus, in this example the resistor has bottom contacts i.e. its terminals are formed directly on the substrate surface and the resistive body (20) is formed so as to overlap those resistor terminals on top. FIG. 12g illustrates a further step, where the remaining resist material of the layer (9) has been removed and FIG. 12h illustrates the final structure resulting from formation of the dielectric layer (4) over the structure shown in FIG. 12g, and then formation of a gate electrode (13) over the transistor channel body (10). Thus, in the embodiment illustrated in FIG. 12, the channel body (10) and resistor body (20) have been formed from different layers of metal oxide material, those different layers having been formed under different conditions such that the channel (10) exhibits semi-conductive behaviour and the resistor body (20) exhibits resistive behaviour.

Also, in the embodiment shown in FIG. 12, the resistor body (0) has been formed after formation of the conductive contacts of both the transistor and resistor.

Figure 13A:
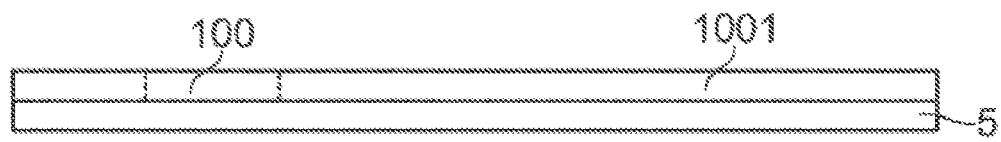
FIGS. 13A-13O, 14A-14B, and 15A-15F illustrate steps in three other methods embodying the invention.
Figure 13B:
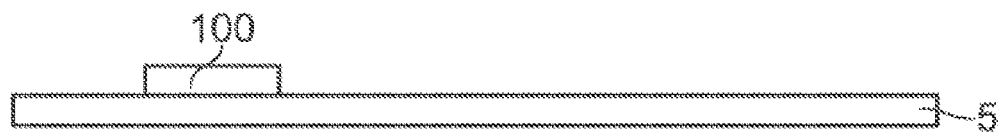
Figure 13C:
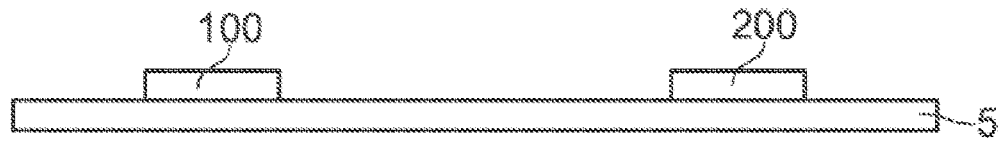

Referring to FIG. 13, this shows an alternative technique where the first and second bodies are formed at different times, but before formation of the conductive contacts. FIG. 13a shows the initial formation of a first layer (1001) of metal oxide material including the first quantity (100), on top of the substrate (5). By suitable techniques this layer (1001) is patterned to yield the structure shown in FIG. 13b, comprising the first quantity (100) of metal oxide material on the substrate. Then, in FIG. 13c, the second quantity of metal oxide material (200) has been formed on a different region of the substrate, after formation of the first quantity (100).

Figure 14A:
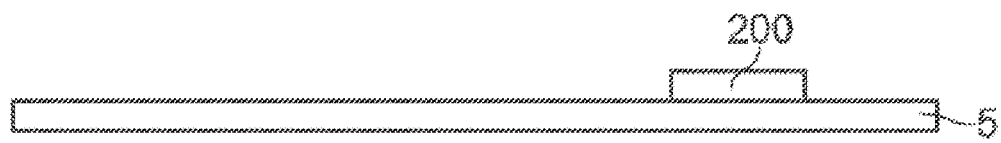
Figure 14B:
Figure 15A:
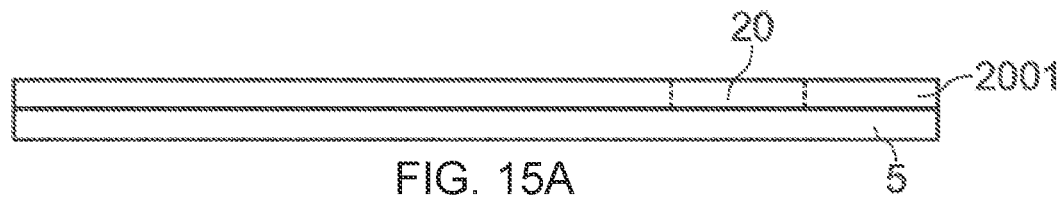
Figure 15B:
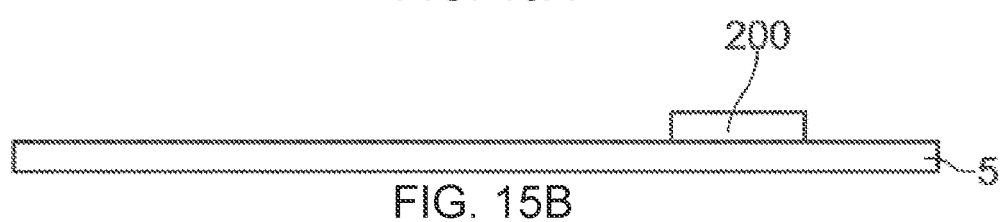
Figure 15C:
Figure 15D:
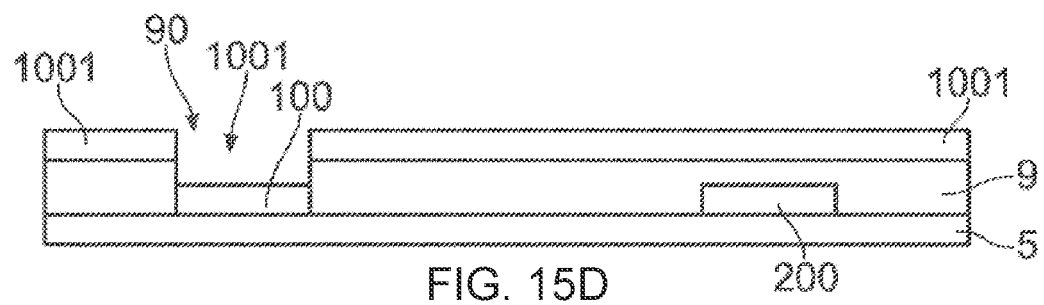
Figure 15E:
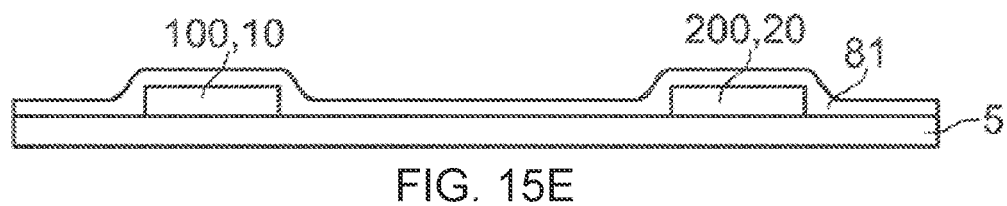
Figure 15F:
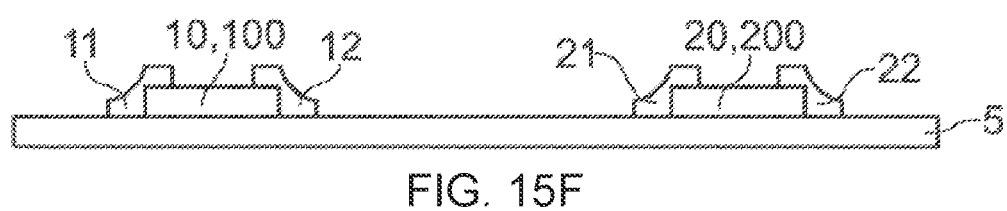

Referring now to FIG. 14, this shows an alternative method in which the second quantity of metal oxide material (200) is formed initially on the substrate surface. Then, as illustrated in FIG. 14b, the first quantity (100) is formed on a different portion of the substrate, after forming the second quantity (200).

Referring now to FIG. 15, this illustrates yet another method of forming an electronic circuit module embodying the invention. As shown in FIG. 15a, a layer (2001) of metal oxide material is first formed on the substrate (5), that layer (2001) comprising the second quantity of metal oxide material (200) which will form the body of the resistor. Using suitable techniques, that layer (2001) is patterned, to yield the structure shown in FIG. 15b. This second quantity (200) has been formed under conditions such that the metal oxide material exhibits resistive behaviour. Then, as shown in FIG. 15c, a layer of resist material (9) has been formed. Then, as shown in FIG. 15d, a window (90) has been formed in the resist layer (9), and a layer (1001) of metal oxide material has been deposited, so as to cover the portion of substrate exposed by the window (90) with a first quantity of metal oxide material (100). The formation conditions of the layer (1001) are such that this first quantity (100) is substantially semi-conductive, in contrast to the resistive second quantity (200), even without any subsequent processing. The remaining resist material is then removed by suitable techniques, and a layer of conductive material (81) is formed on top of the underlaying structure, to yield that illustrated in FIG. 15e. That conductive layer (81) is then patterned to yield the structure shown in FIG. 15f, comprising the transistor source and train terminals and the first and second resistor terminals (21, 22), It will be appreciated that the other components of the circuit module may then be built up on top of this structure, using appropriate techniques.

Figure 16:
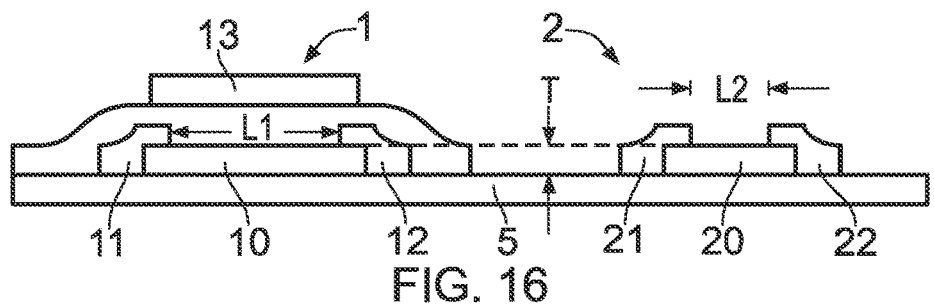
FIGS. 16-23 illustrate parts of other electronic circuits embodying the invention.

Referring now to FIG. 16, this illustrates part of another circuit module embodying the invention. In this example, each of the first and second bodies (10, 20) is being formed from a layer, sheet, or film of metal oxide material. In this example, the thickness of that layer, film or sheet is T. Thus, the first and second bodies (10, 20) each have the same thickness. However, the semi-conductive channel provided by the first body (10) has length L1, and the resistive path provided by the second body (20) has length L2, where L1 is different from L2. In certain alternative embodiments, however, it will be appreciated that the channel and resistive path may have the same length as each other.

Figure 17:
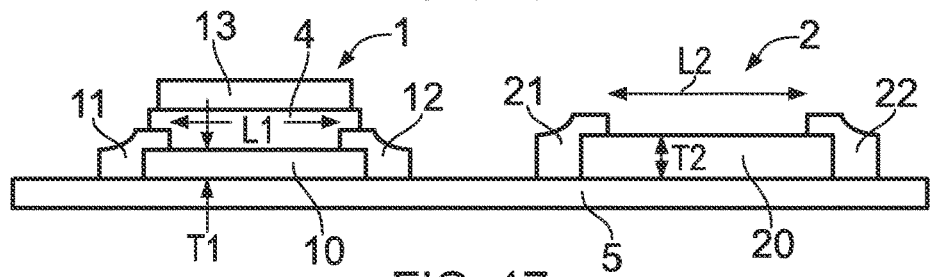

Referring now to FIG. 17, this illustrates yet another embodiment, where the first body (10) has thickness T1, and the second body (20) has a different thickness T2. Again, the length L1 of the channel and the length L2 of the resistive path are different.

Figure 18:
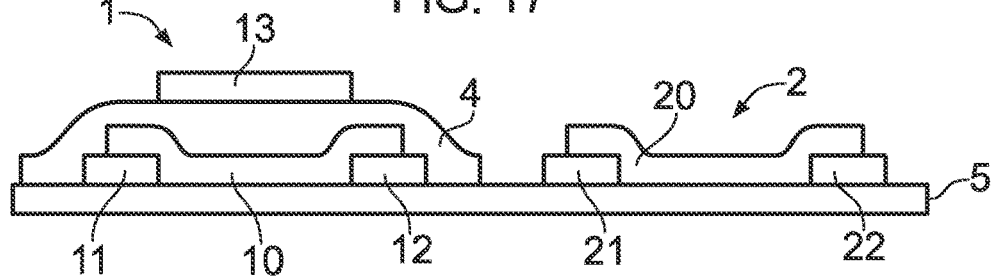
Figure 19:
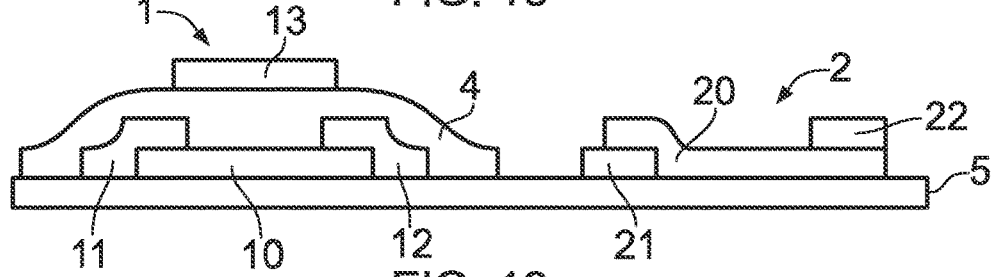

It will be appreciated from FIGS. 16 and 17 that, in certain embodiments, the first and second bodies (10, 20) are formed on different respective areas of a surface of the substrate (5), and then the contacts or terminals (11, 12, 21, 22) are formed subsequently, so as to overlap upper surfaces of the first and second bodies (10, 20). FIG. 18 illustrates an alternative embodiment, in which the source and drain terminals (11, 12) and first and second resistor terminals (21, 22) have been formed on the substrate (5) before formation of the first and second bodies (10, 20). Thus, the first body (10) partially overlaps the source and drain terminals (11, 12) in this example, and the second body (20) also partially overlaps upper surfaces of the resistor terminals (21 and 22). A gate dielectric (4) has been formed over the first body (10) and terminals (11, 12), and a gate terminal (13) has been formed on top of the gate dielectric. Thus, it will be appreciated from FIG. 18 that the first body (10) and/or second body (20) are not necessarily planar in all embodiments of the invention. This is further illustrated by FIG. 19, which shows a circuit module embodying the invention where the first body (10) has been formed initially on a surface of the substrate (5), under conditions such that its behaviour is semi-conductive. The source and drain terminals (11, 12) and first resistor terminal (21) have then been formed at the same time, with the source and drain terminals (11, 12) partially overlapping upper surfaces of the first body (10). The first resistor terminal (21) is formed directly on a portion of the surface of the substrate (5). The second body (20) has been formed in a subsequent step (i.e. after formation of the first body (10)), under conditions such that it exhibits resistive behaviour, and that second body (20) covers at least part of the upper surface of the first resistor terminal (21) and a portion of the substrate surface (5) adjacent that first terminal (21). The second resistor terminal (22) has been formed later, and sits on top of the second body (20). Thus, the resistor body (20) is again not simply planar. In this example, it is stepped, and the first and second resistor terminals (21, 22) have been formed in different steps (or different sequences of steps) i.e. from different conductive layers. Thus, the resistor terminals, in this example, are not formed at the same time (or in the same processing step or sequence of steps) as each other.

Figure 20:
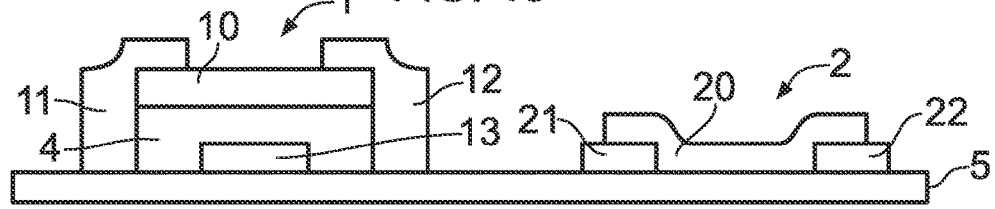

Referring now to FIG. 20, this shows an alternative circuit embodying the invention where the transistor (1) has a bottom gate structure, and the resistor has bottom contacts. It will be appreciated that the structure shown in FIG. 20 may be formed by a method in which the gate and resistor contacts (21 and 22) may be formed at the same time, for example by the patterning of an initially continuous layer of conductive material formed on a surface of the substrate (5), the resistive body (20) may then be formed form metal oxide material under conditions such that it exhibits resistive behaviour. Then, the gate dielectric may be formed before forming the channel body (10) above the gate, this time under conditions such that the channel body (10) is semi-conductive rather than resistive. The source and drain contacts (11, 12) may then be formed, by suitable techniques. In this example the first body (10) and second body (20) are not coplanar, however their respective planes of orientation are parallel to each other.

Figure 21:
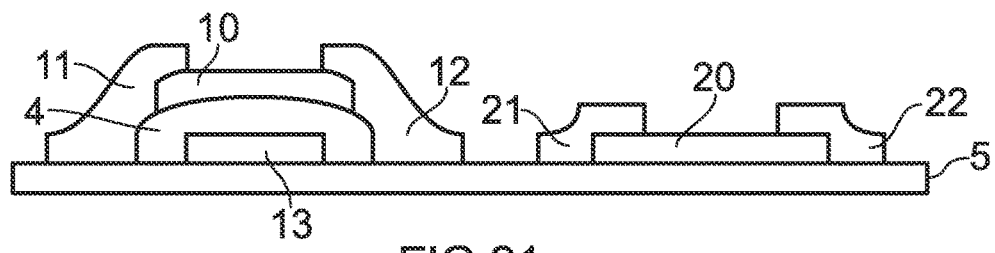

Referring now to FIG. 21, this illustrates an alternative circuit module embodying the invention, where the transistor (1) has a bottom gate structure, and the resistor has overlapping top contacts (21, 22). To form the structure of FIG. 21, the gate terminal may first be formed. Then the resistor body (20) may be formed, before or after formation of the gate dielectric. The transistor body (10) is then formed after the resistor body (20), and the source and drain terminals (11, 12) and resistor terminals (21, 22) may be formed in different steps or at the same time as one another, for example by patterning a layer of conductive material.

Figure 22:
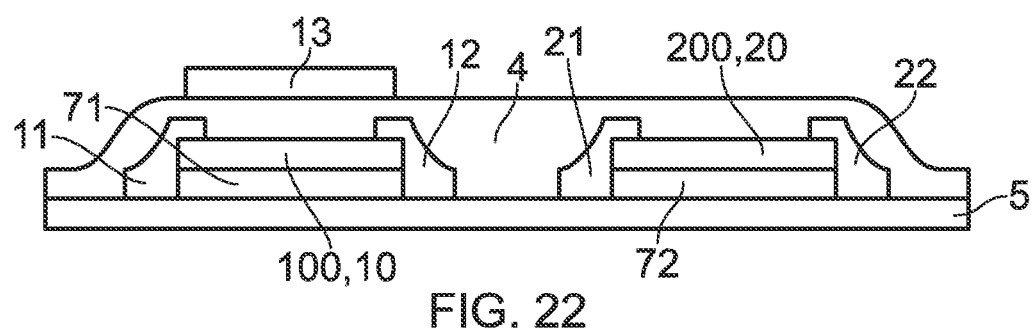

Referring now to FIG. 22, this shows an alternative embodiment in which the first and second quantities (100, 200) of metal oxide material have been formed at the same or different times, under the same or different processing conditions. However, the first quantity (100) has been formed over a first dopant source (71) and the second quantity (200) has been formed over a second dopant source (72). The dopant materials and/or their concentrations have been selected such that the interaction of the first quantity of metal oxide material (100) with the first dopant source (71) results in the first body (10) being semi-conductive, and the interaction of the second quantity of metal oxide material (200) interacts with the second dopant source (72) such that the second body (20) provides a resistive current path between the terminals (21, 22).

Figure 23:
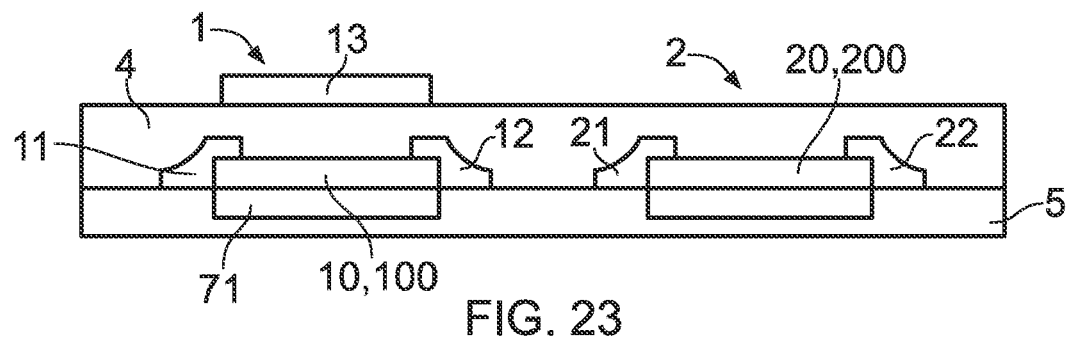
Figure 24A:
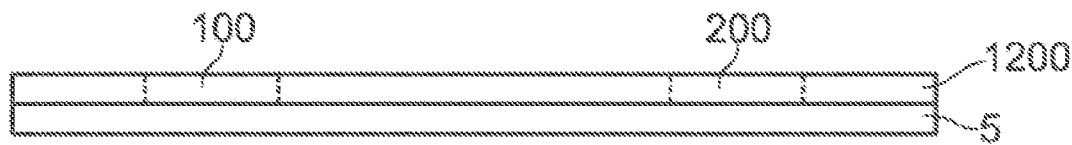
FIGS. 24A-24H illustrate steps in another method of manufacturing an electronic circuit n accordance with the present invention.
Figure 24B:
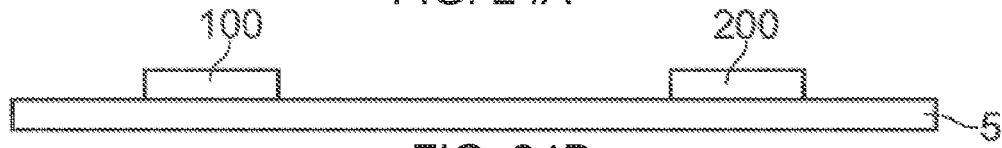
Figure 24C:
Figure 24D:
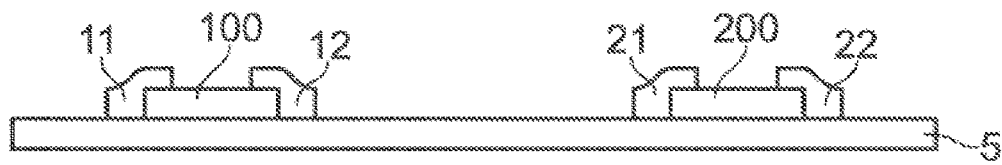
Figure 24E:
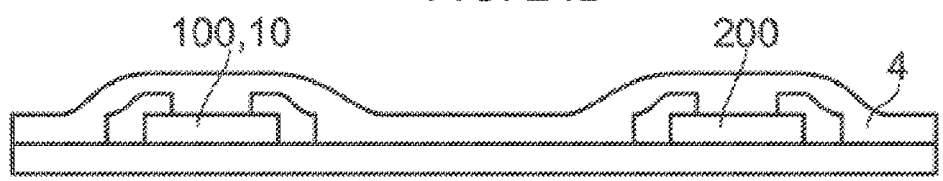
Figure 24F:
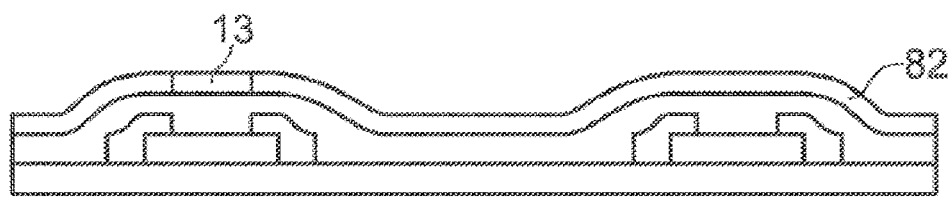
Figure 24G:
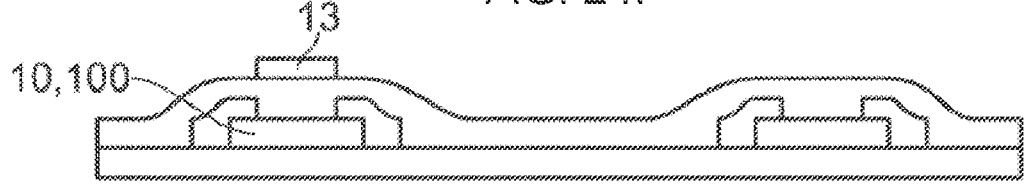
Figure 24H:
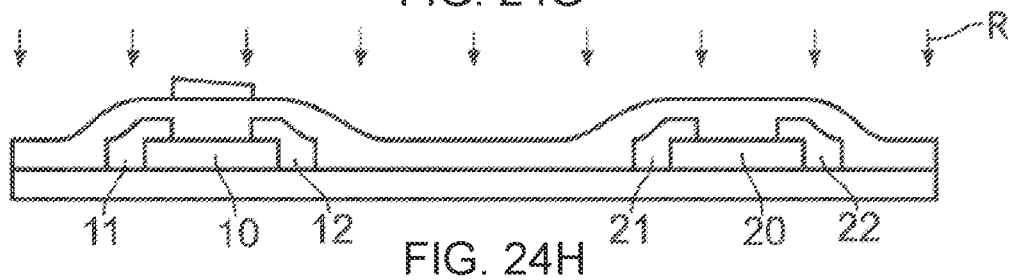

FIG. 23 illustrates a similar embodiment in which the substrate (5) itself has been doped selectively in different regions to provide the different dopant sources (71 and 72) which interact with the first and second quantities (100, 200) to yield a semi-conductive channel and resistive body respectively.

Referring now to FIG. 24, the is illustrates steps in a further method embodying the invention. In step 24a, a layer of metal oxide material (1200) has been formed on a surface of the substrate (5), that layer (1200) comprising first and second quantities (100, 200) of metal oxide material. That structure is then patterned by suitable technique to yield the structure shown in FIG. 24b, a layer of conductive material (81) is then deposited over that structure to yield the structure shown in FIG. 24c, and that layer (81) is then patterned by suitable techniques to yield the structure shown in FIG. 24d, with portions of the previous conductive layer (81) forming the resistor terminals (21, 22) and source and drain terminals (11 and 12), each of those terminals partly overlapping an upper surface of the respective quantity (100, 200) of metal oxide material. A layer of dielectric material (4) is then formed to yield the structure shown in FIG. 24e, and a second layer of conductive material (82) is formed on top, that layer (82) comprising the material which will form the gate terminal (13). That second layer is then patterned by suitable techniques to yield the structure shown in FIG. 24g, with the gate terminal (13) above the semi-conductive channel body (10). At the stage illustrated in FIG. 24g, each of the quantities (100, 200) may be substantially semi-conductive (e.g. "normally off" semiconductor material), FIG. 24h shows a subsequent step in which the structure of FIG. 24g is exposed to electro-magnetic radiation R to thermally anneal (or otherwise affect) just the second quantity (200) of metal oxide material, increasing its conductivity and changing its properties from semi-conductive (normally off) to resistive. The gate (13) acts as a mask or shield, and shields the first quantity (100) from the radiation R such that it is substantially unaffected by the radiation and hence the transistor body (10) exhibits semi-conductive behaviour rather than resistive. Advantageously, this embodiment is one in which the metal oxide material for the transistor channel and resistor body may be deposited at the same time. The difference in eventual electrical properties of the channel and resistor body are achieved by the different subsequent processing.

It will be appreciated that although certain embodiments provide flexible electronic circuits, such as flexible ICs, and/or low cost circuits, other embodiments may provide circuits, such as ICs, that are not flexible, nor necessarily low cost, for example those manufactured on rigid substrates or part-complete systems.

Any suitable material(s) may be used as a substrate (5), which may be composed from one or more layers of such materials. The substrate (5) may be flexible, comprising any one or more materials from the following list: Glass (rigid or flexible); polymer (e.g. polyethylene naphthalate, polyethylene terephthalate; polymethyl methacrylate; polycarbonate, polyvinylalcohol; polyvinyl acetate; polyvinyl pyrrolidone; polyvinylphenol; polyvinyl chloride; polystyrene; polyethylene naphthalate; polyethylene terephthalate; polyimide, polyimide (e.g. Nylon); poly(hydroxyether); polyurethane; polycarbonate; polysulfone; parylene; polyarylate; polyether ether ketone (PEEK); acrylonitrile butadiene styrene; 1-Methoxy-2-propyl acetate (SU-8); polyhydroxybenzyl silsesquioxane (HSQ); Benzocyclobutene (BCB)); Al2O3, SiOxNy; SiO2; Si3N4; UV-curable resin; Nanoimprint resist; photoresist; polymeric foil; paper; insulator-coated metal (e.g. coated stainless-steel); cellulose.

Any suitable material(s) may be used as a layer of dielectric material (4), which may be composed from one or more layers of such materials. Examples of suitable materials include: Metal oxides such as Al2O3, ZrO2, HfO2, Y2O3, Si3N5, TiO2, Ta2O5; metal phosphates such as Al2POx; metal sulphates/sulphites such as HfSOx; metal nitrides such as AlN; metal oxynitride such as AlOxNy; inorganic insulators such as SiO2, Si3N4, SiNx; spin on glass (such as polyhydroxybenzyl silsesquioxane, HSQ), polymeric dielectric materials (such as Cytop, a commercially available amorphous fluoropolymer), 1-Methoxy-2-propyl acetate (SU-8), benzocyclobutene (BCB), polyimide, polymethyl methacrylate, polybutyl methacrylate, polyethyl methacrylate, polyvinyl acetate, polyvinyl pyrrolidone, polyvinylphenol, polyvinylchloride, polystyrene, polyethylene, polyvinyl alcohol, polycarbonate, parylene, silicone; UV curable resins; Nanoimprint resists; or photoresists. The dielectric material may have a relatively low dielectric constant (low-K, e.g. Cytop, HSQ, parylene) or a relatively high dielectric constant (high-κ, e.g. Ta2O5, HfO2).

Any suitable material(s) may be used to form the transistor source, drain and gate terminals (11, 12, 13) and the resistor terminals (21, 22), any of which may be composed from one or more layers of such materials. Examples of suitable materials include: Metals, such as Au, Ti, Al, Mo, Pt, Pd, Ag, Cu, Ni, Cr, Ta, W; metal alloys, such as MoNi, MoCr, AlSi; transparent conductive oxides, such as ITO, IZO, AZO; metal nitrides, such as TiN; carbon materials, such as carbon black, carbon nanotubes, graphene; conducting polymers, such as polyaniline, PEDOT:PSS; or semiconductor material.

Any suitable material may be used to form the first body (10) of material providing a controllable semi-conductive channel and the second body (20) of material providing a resistive current path, and any other further semi-conductive and resistive bodies in the circuit. The first body (10) or the second body (20) or both bodies may be composed from one or more layers of such materials. Examples of suitable materials include metal oxides, such as ZnO, SnO2, NiO, SnO, Cu2O, In2O3, LiZnO, ZnSnO, InSnO (ITO), InZnO (IZO), HfInZnO (HIZO), InGaZnO (IGZO), AlZnO (AZO). Other suitable materials may include organic materials such as polymers, compound semiconductors, 2D materials such as graphene, and perovskites. A suitable material is one that may be used to form a resistive body or a semi-conductive body depending on its stoichiometry, deposition, processing and/or doping. The first body (10) and second body (20) may both consist of the same material. In other embodiments either the first body (10) or the second body (20) or both bodies (10, 20) may each comprise an additional material that may be taken from the above list or may be a different type of material such as a conductor, an insulator or a different type of semiconductor. Thus, another aspect of the invention provides an electronic circuit (or circuit module) comprising a transistor and a resistor, the transistor comprising a source terminal, a drain terminal, a gate terminal, and a first body providing a controllable semiconductive channel between the source and drain terminals, the resistor comprising a first resistor terminal, a second resistor terminal, and a second body providing a resistive current path between the first resistor terminal and the second resistor terminal, wherein said first body comprises a first quantity of a material and said second body comprises a second quantity of said material. Another aspect provides a method of manufacturing such a circuit, comprising forming said first body and forming said second body.

It will also be appreciated from the above-description that certain embodiments of the invention provide improvements to unipolar (i.e. based on either p-type or n-type semiconductors) circuits (e.g. FlexICs) to extend their capabilities for low cost processing, sensing, communication and other applications. The approach is based on the integration of resistors into the circuits (e.g. FlexICs) along with the unipolar transistors. These resistors, in certain embodiments, have some or all of the following properties:

1. Used as a transistor load they enable FlexICs to incorporate logic circuits of greater complexity and efficiency
2. Used in analogue circuits they enable timers and other essential functions in, for example, RF circuits
3. They exhibit sheet resistance values of between approximately 50 k$\Omega$/□ and 10 M$\Omega$/□
4. They may be fabricated using established thin-film deposition techniques, e.g. PVD, CVD, etc.
5. They do not require post-deposition processing of either long duration or high energy consumption
6. They have a high optical transmittance, and may be substantially transparent
7. They are formed from a material composed of the same elements as those in the semiconductor channel of the transistors (e.g. FlexIC's transistors)
8. They are formed from a metal oxide (e.g. NiO, SnO, IGZO)
9. They are formed from Indium Gallium Zinc Oxide (IGZO)
10. They are located in one or more layers of the FlexIC
11. They are located in either the same or different layer(s) as the semiconductor channel of the FlexIC's transistors The present inventors are aware that electronic properties of metal oxides have been investigated with some intensity relatively recently. Much of this work has been in the context of (i) very low resistivity, for application as transparent conducting oxides such as indium tin oxide, or (ii) very high resistivity, for semiconductor applications. The present inventors appreciate that electromagnetic irradiation, such as from a UV laser or lamp, may reduce the resistivity of a metal oxide semiconductor material from the order of $10^9$ $\Omega$/□ to around $10^5$ $\Omega$/□. Accordingly, certain embodiments of the present invention use electromagnetic irradiation to modify resistance for the purposes of setting the resistance of one or more resistors in a circuit (e.g. an IC).

Resistors in embodiments of the present invention are formed from metal oxides. Their resistivities may be determined primarily by the stoichiometry of the metal oxides, by the techniques and conditions used to deposit and process them, and by the incorporation of elements from neighbouring materials in the IC structure. For example, a pre-patterned dopant or one present in a layer above or beside the resistor may selectively cause the metal oxide semiconductor film to become resistive after deposition and processing:

By depositing a quantity of initially semiconductive material on top of a dopant (or source of said dopant), the dopant may then change the semiconductive film to a resistive film. This technique is used in certain embodiments.

The dopant may donate atoms, e.g. O, H, F, N, Y, to the initially semiconductive layer, or alternatively the dopant may accept such atoms from the initially semiconductive layer to leave vacancies in the material (and so increase its conductivity/reduce its resistivity). Alternatively a metal oxide film may be deposited as a resistive layer with a pre-patterned dopant selectively causing the resistive layer to become semiconductive.

In another example a semiconducting film may be formed from a material having one stoichiometry (molar proportion of elements) whilst a resistive film may be formed from the same material having a different stoichiometry.

Thus, to achieve a semiconductive channel and a resistive body, each comprising the same metal oxide, the respective quantities of metal oxide material may exhibit different stoichiometries and/or may be formed/deposited under different conditions and/or may be processed differently after being formed. Deposition/processing examples of how to differentiate the resistive bodies from semiconductor channels comprising the same metal oxide material can include the following, either individually or in combinations, and for a body comprising more than one layer of material the deposition/processing may be different for each layer:

Deposition (e.g, of IGZO) by PVD or by ALD (atomic layer deposition) in the presence, absence or different concentrations of O2, N2, F, H2

Deposition by PVD vs ALD

By thermal annealing, e.g. by annealing only resistive bodies or semiconductor channels, or annealing both resistive bodies and semiconductor channels in different conditions of temperature and/or presence of air, O2, N2, Ar, H2, forming gas, etc.

By plasma treatment, e.g. CF4, Ar, O2, N2, NF3, H2, during or after deposition

By UV laser or excimer lamp (as noted above)

By controlling the thicknesses of the semiconductive channel and the resistive body.

The invention claimed is:

1. A method of manufacturing an electronic circuit for circuit module comprising a transistor and a resistor, the transistor comprising a source terminal, a drain terminal, a gate terminal, and a first body of material providing a controllable semiconductive channel between the source and drain terminals, and the resistor comprising a first resistor terminal, a second resistor terminal, and a second body of material providing a resistive current path between the first resistor terminal and the second resistor terminal, the method comprising:

forming the first body; and
forming the second body,
wherein the first body comprises a first quantity of a metal oxide and the second body comprises a second quantity of said metal oxide,
wherein forming the first body comprises forming said first quantity of said metal oxide, and forming the second body comprises forming said second quantity of said metal oxide, and
wherein said forming of said first quantity is performed before or after said forming of said second quantity.

2. The method in accordance with claim 1, wherein forming said first quantity comprises forming said first quantity directly or indirectly on a first region of a substrate, and forming said second quantity comprises forming said second quantity directly or indirectly on a second region of the substrate.

3. The method in accordance with claim 1, wherein said forming of said first quantity comprises forming said first quantity using a technique selected from a list comprising: physical deposition; physical vapour deposition (PVD); chemical deposition; chemical vapour deposition (CVD); atomic layer deposition (ALD); physical-chemical deposition; evaporation; sputtering; sol-gel techniques; chemical bath deposition; spray pyrolysis; plating techniques; pulsed laser deposition (PLD); solution processing; and spin coating.

4. The method in accordance with claim 1, wherein said forming of said second quantity comprises forming said second quantity using a technique selected from a list comprising: physical deposition; physical vapour deposition (PVD); chemical deposition; chemical vapour deposition (CVD); atomic layer deposition (ALD); physical-chemical deposition; evaporation; sputtering; sol-gel techniques; chemical bath deposition; spray pyrolysis; plating techniques; pulsed laser deposition (PLD); solution processing; and spin coating.

5. The method in accordance with claim 1, wherein said forming of said first quantity comprises forming (e.g. by depositing or otherwise forming) a first layer, film, or sheet of said metal oxide, said first layer, film, or sheet comprising said first quantity.

6. The method in accordance with claim 5, wherein said forming of said first body comprises patterning the first layer, film, or sheet.

7. The method in accordance with claim 1, wherein said forming of said second quantity comprises forming (e.g. by depositing or otherwise forming) a second layer, film, or sheet of said metal oxide, said second layer, film, or sheet comprising said second quantity.

8. The method in accordance with claim 7, wherein said forming of the second body comprises patterning the second layer, film, or sheet.

9. The method in accordance with claim 1, further comprising doping said first body of material with a first dopant to decrease (or increase) an electrical conductivity of said first body.

10. The method in accordance with claim 9, wherein doping said first body of material comprises forming said first quantity on a source of said first dopant.

11. The method in accordance with claim 9, wherein doping said first body of material comprises forming a source of said first dopant on said first body of material.

12. The method in accordance with claim 1, further comprising processing said second body (e.g. processing said second quantity of said metal oxide) to increase or decrease an electrical conductivity of the second body.

13. The method in accordance with claim 12, wherein said processing of the second body comprises exposing at least a portion of the second body to electromagnetic radiation.

14. The method in accordance with claim 13, further comprising providing said electromagnetic radiation from a lamp.

15. The method in accordance with claim 13, further comprising providing said electromagnetic radiation from a laser.

16. The method in accordance with claim 13, further comprising shielding at least a portion of the first body (e.g. at least a portion of the first quantity of said metal oxide) from said electromagnetic radiation.

17. The method in accordance with claim 16, wherein said shielding comprises using said gate terminal to shield said at least a portion of the first body or said at least a portion of the first quantity from said electromagnetic radiation.

* * * * *